US012641875B2

(12) United States Patent
Liaw

(10) Patent No.: US 12,641,875 B2
(45) Date of Patent: *May 26, 2026

(54) INTEGRATED CIRCUIT DEVICE AND METHOD OF FORMING THE SAME

(71) Applicant: Taiwan Semiconductor Manufacturing Co., Ltd., Hsin-Chu (TW)

(72) Inventor: Jhon Jhy Liaw, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 119 days.

This patent is subject to a terminal disclaimer.

(21) Appl. No.: 18/628,325

(22) Filed: Apr. 5, 2024

(65) Prior Publication Data

US 2024/0274605 A1 Aug. 15, 2024

Related U.S. Application Data

(60) Continuation of application No. 17/400,965, filed on Aug. 12, 2021, now Pat. No. 11,955,486, which is a (Continued)

(51) Int. Cl.
*H10D 84/85* (2025.01)
*H10D 30/62* (2025.01)
(Continued)

(52) U.S. Cl.
CPC ....... *H10D 84/853* (2025.01); *H10D 30/6219* (2025.01); *H10D 84/0158* (2025.01);
(Continued)

(58) Field of Classification Search
CPC ............. H01L 27/0886; H01L 27/0924; H01L 27/10826; H01L 27/10879; H01L 27/1211;
(Continued)

(56) References Cited

U.S. PATENT DOCUMENTS 6,635,935 B2 * 10/2003 Makino ............ H10D 84/83125
257/376
7,465,973 B2 * 12/2008 Chang .................... H10B 10/00
257/E27.099

(Continued)

*Primary Examiner* — Maliheh Malek
(74) *Attorney, Agent, or Firm* — Cooper Legal Group, LLC

(57) ABSTRACT

An integrated circuit device includes a first device and a second device. The first device is disposed within a first circuit region, the first device including a plurality of first semiconductor strips extending longitudinally in a first direction. Adjacent ones of the plurality of first semiconductor strips are spaced apart from each other in a second direction, which is generally perpendicular to the first direction. The second device is disposed within a second circuit region, the second circuit region being adjacent to the first circuit region in the first direction. The second device includes a second semiconductor strip extending longitudinally in the first direction. A projection of a longitudinal axis of the second semiconductor strip along the first direction lies in a space separating the adjacent ones of the plurality of first semiconductor strips.

20 Claims, 26 Drawing Sheets

Related U.S. Application Data division of application No. 16/415,320, filed on May 17, 2019, now Pat. No. 11,094,695.

(51) Int. Cl.

| | |
|---|---|
| *H10D 84/01* | (2026.01) |
| *H10D 84/03* | (2025.01) |
| *H10D 84/83* | (2025.01) |
| *H10D 89/10* | (2025.01) |
| *H10D 84/90* | (2025.01) |

(52) U.S. Cl.
CPC ....... *H10D 84/0193* (2025.01); *H10D 84/038* (2025.01); *H10D 84/834* (2025.01); *H10D 89/10* (2025.01); *H10D 84/912* (2025.01); *H10D 84/931* (2025.01); *H10D 84/961* (2025.01); *H10D 84/964* (2025.01); *H10D 84/975* (2025.01); *H10D 84/987* (2025.01)

(58) Field of Classification Search
CPC ......... H01L 27/0928; H01L 21/823431; H01L 21/823821; H01L 21/845; H01L 29/41791; H01L 29/66772; H01L 29/66795; H01L 29/7831; H01L 29/785; H01L 29/7858; H01L 29/786; H01L 2924/13067; H01L 27/0207; H01L 29/66545; H01L 21/027; H01L 21/70; H01L 29/401; H10D 84/853; H10D 30/6219; H10D 84/0158; H10D 84/0193; H10D 84/038; H10D 84/834; H10D 89/10; H10D 84/912; H10D 84/931; H10D 84/961; H10D 84/964; H10D 84/975; H10D 84/987; H10D 64/017; H10D 84/974; H10D 84/907; H10D 84/0128; H10D 84/0149; H10D 84/0151

See application file for complete search history.

(56) References Cited

U.S. PATENT DOCUMENTS

| | | | | |
|---|---|---|---|---|
| 7,681,164 B2 * | 3/2010 | Lin | ...................... | G06F 30/392 |
| | | | | 716/120 |
| 7,812,373 B2 * | 10/2010 | Bauer | .................... | H10B 10/12 |
| | | | | 716/132 |
| 8,026,138 B2 * | 9/2011 | Lee | ...................... | H10B 12/056 |
| | | | | 257/E27.095 |
| 8,315,084 B2 * | 11/2012 | Liaw | .................... | G11C 11/413 |
| | | | | 365/189.11 |
| 8,772,109 B2 * | 7/2014 | Colinge | ............ | H01L 21/30625 |
| | | | | 438/269 |
| 8,785,285 B2 * | 7/2014 | Tsai | .................... | H10D 30/024 |
| | | | | 257/E21.409 |
| 8,813,014 B2 * | 8/2014 | Yu | ......................... | H10D 89/10 |
| | | | | 716/135 |
| 8,816,444 B2 * | 8/2014 | Wann | ................... | H10D 84/834 |
| | | | | 716/110 |
| 8,823,065 B2 * | 9/2014 | Wang | .................. | H10D 62/021 |
| | | | | 257/745 |
| 8,847,361 B2 * | 9/2014 | Liaw | .................... | H10D 84/038 |
| | | | | 438/164 |
| 8,860,148 B2 * | 10/2014 | Hu | ..................... | H10D 30/6211 |
| | | | | 257/369 |
| 8,908,421 B2 * | 12/2014 | Liaw | .................... | G11C 11/419 |
| | | | | 365/72 |
| 9,099,172 B2 * | 8/2015 | Liaw | ........................ | G11C 8/16 |
| 9,105,490 B2 * | 8/2015 | Wang | ............... | H01L 21/76856 |
| 9,123,565 B2 * | 9/2015 | Lu | .................... | G06F 30/392 |
| 9,236,267 B2 * | 1/2016 | De | .................... | H01L 21/3088 |
| 9,236,300 B2 * | 1/2016 | Liaw | ................ | H01L 21/76895 |
| 9,257,439 B2 * | 2/2016 | Liaw | .................... | H10B 10/12 |
| 9,317,646 B2 * | 4/2016 | Lu | ......................... | G06F 30/392 |
| 9,362,290 B2 | 6/2016 | Liaw et al. | | |
| 9,397,095 B1 * | 7/2016 | Cheng | ............. | H10D 84/83138 |
| 9,520,482 B1 * | 12/2016 | Chang | ................. | H10D 84/038 |
| 9,576,814 B2 * | 2/2017 | Wu | .................... | H01L 21/30604 |
| 9,590,074 B1 * | 3/2017 | Pranatharthiharan | .... | H10D 1/00 |
| 9,613,953 B2 * | 4/2017 | Liaw | ...................... | H10D 89/10 |
| 9,653,295 B1 * | 5/2017 | Huang | ................. | H10B 10/18 |
| 9,673,202 B2 * | 6/2017 | Liaw | .................... | H10B 10/12 |
| 9,793,273 B2 * | 10/2017 | Liaw | ................... | H10D 64/667 |
| 9,805,985 B2 | 10/2017 | Liaw | | |
| 9,929,087 B2 * | 3/2018 | Guo | ................. | H01L 23/53204 |
| 10,056,390 B1 * | 8/2018 | Liaw | .................... | G11C 11/412 |
| 10,090,289 B1 * | 10/2018 | Hsu | ...................... | H01L 23/528 |
| 10,170,555 B1 * | 1/2019 | Liao | .................... | H10D 84/0193 |
| 10,276,581 B1 * | 4/2019 | Liaw | ...................... | H10D 89/10 |
| 10,361,198 B2 * | 7/2019 | Rastogi | ................ | H01L 23/535 |
| 10,522,528 B2 * | 12/2019 | Liaw | ................... | H10D 30/6219 |
| 10,529,712 B2 * | 1/2020 | Kim | .................... | H10D 84/038 |
| 10,651,175 B2 * | 5/2020 | Shimbo | ................ | H10D 84/853 |
| 11,063,032 B2 * | 7/2021 | Liaw | ...................... | H10D 89/10 |
| 11,088,262 B2 * | 8/2021 | Tsai | ..................... | H10D 30/611 |
| 11,171,003 B2 * | 11/2021 | Liao | ................... | H10D 30/0241 |
| 2005/0094434 A1 * | 5/2005 | Watanabe | ............. | G11C 11/412 |
| | | | | 365/156 |
| 2005/0153490 A1 * | 7/2005 | Yoon | .................... | H10D 86/201 |
| | | | | 438/164 |
| 2006/0289945 A1 * | 12/2006 | Nii | ......................... | H10B 10/12 |
| | | | | 257/E27.099 |
| 2008/0042171 A1 * | 2/2008 | Mosler | ...................... | G03F 1/30 |
| | | | | 257/E27.06 |
| 2008/0179682 A1 * | 7/2008 | Bauer | .................... | H10B 10/12 |
| | | | | 257/E27.098 |
| 2008/0186059 A1 * | 8/2008 | Nozoe | .................... | H10D 84/907 |
| | | | | 326/103 |
| 2008/0191282 A1 * | 8/2008 | Bauer | .................... | H10B 10/12 |
| | | | | 257/E27.098 |
| 2010/0269081 A1 * | 10/2010 | Hou | ......................... | G06F 30/39 |
| | | | | 716/130 |
| 2011/0133285 A1 * | 6/2011 | Liaw | ...................... | H10B 10/00 |
| | | | | 257/E27.098 |
| 2012/0106225 A1 * | 5/2012 | Deng | ...................... | G06F 30/39 |
| | | | | 716/55 |
| 2013/0126978 A1 * | 5/2013 | Becker | ................. | H10D 84/038 |
| | | | | 257/369 |
| 2013/0140711 A1 * | 6/2013 | Iwasaki | .................. | H01L 23/481 |
| | | | | 257/774 |
| 2013/0161756 A1 * | 6/2013 | Glass | ................. | H10D 30/6757 |
| | | | | 257/E21.632 |
| 2013/0207199 A1 * | 8/2013 | Becker | .................... | G06F 30/39 |
| | | | | 257/369 |
| 2014/0153321 A1 * | 6/2014 | Liaw | ...................... | G11C 11/413 |
| | | | | 365/154 |
| 2015/0243503 A1 * | 8/2015 | Leobandung | ...... | H10D 84/0193 |
| | | | | 438/427 |
| 2015/0243667 A1 * | 8/2015 | Liaw | .................... | H10B 10/12 |
| | | | | 716/110 |
| 2015/0318181 A1 * | 11/2015 | Cantone | ............. | H10D 84/0158 |
| | | | | 438/702 |
| 2015/0318215 A1 * | 11/2015 | Taylor, Jr. | ............. | H01L 21/762 |
| | | | | 438/424 |
| 2016/0027769 A1 * | 1/2016 | Baek | ...................... | H10D 89/10 |
| | | | | 257/369 |
| 2016/0155739 A1 * | 6/2016 | Ting | ................... | H10D 84/0158 |
| | | | | 438/283 |
| 2016/0172360 A1 * | 6/2016 | Shimbo | ................ | H10D 84/834 |
| | | | | 257/401 |
| 2016/0190138 A1 * | 6/2016 | Shimbo | .................. | H10D 89/10 |
| | | | | 257/369 |
| 2016/0351249 A1 * | 12/2016 | Liaw | ...................... | H10D 30/62 |
| 2017/0061056 A1 * | 3/2017 | Zhuang | ............. | H10D 84/853 |
| 2017/0098648 A1 * | 4/2017 | Lee | ................... | H10D 84/013 |
| 2017/0221907 A1 * | 8/2017 | Hsieh | ................. | H10D 84/0158 |
| 2017/0243791 A1 * | 8/2017 | Jacob | .................. | H10D 86/011 |
| 2017/0271163 A1 * | 9/2017 | Sung | .................. | H01L 21/3085 |
| 2017/0345821 A1 * | 11/2017 | Fu | ......................... | H10D 30/603 |
| 2017/0352659 A1 * | 12/2017 | Basker | .................. | H10D 30/62 |
| 2018/0005691 A1 * | 1/2018 | Liaw | ......................... | G11C 8/16 |

(56)          References Cited

U.S. PATENT DOCUMENTS

| | | | |
|---|---|---|---|
| 2018/0040483 A1* | 2/2018 | Park | H10D 64/519 |
| 2018/0040614 A1* | 2/2018 | Chang | H10D 84/0151 |
| 2018/0102364 A1* | 4/2018 | Rastogi | H01L 21/76 |
| 2019/0006242 A1* | 1/2019 | Wang | H10D 84/0193 |
| 2019/0088639 A1* | 3/2019 | Hsu | H10D 89/10 |
| 2019/0096870 A1* | 3/2019 | Liaw | H10D 62/114 |
| 2019/0096891 A1* | 3/2019 | Liaw | H10D 84/853 |
| 2019/0147928 A1* | 5/2019 | Liaw | H10D 89/10 |
| | | | 365/155 |
| 2019/0155984 A1* | 5/2019 | Chen | G06F 30/398 |
| 2019/0164949 A1* | 5/2019 | Sio | H10D 89/10 |
| 2019/0164971 A1* | 5/2019 | Liaw | H10D 84/0188 |
| 2019/0172911 A1* | 6/2019 | Huang | H10D 48/30 |
| 2019/0198530 A1* | 6/2019 | Hino | H10D 84/811 |
| 2019/0206879 A1* | 7/2019 | Huang | G11C 11/412 |
| 2019/0279991 A1* | 9/2019 | Elshafie | H01L 21/02595 |
| 2019/0287966 A1* | 9/2019 | Guler | H10D 84/834 |
| 2019/0287967 A1* | 9/2019 | Liaw | H10D 84/038 |
| 2019/0326287 A1* | 10/2019 | Liaw | H10D 84/0193 |
| 2019/0326300 A1* | 10/2019 | Liaw | H10D 62/292 |
| 2019/0363084 A1* | 11/2019 | Jo | H10D 84/853 |
| 2019/0371393 A1* | 12/2019 | Liaw | H10D 89/10 |
| 2020/0006075 A1* | 1/2020 | Wang | H10D 84/038 |
| 2020/0006481 A1* | 1/2020 | Yang | H10D 30/0243 |
| 2020/0020700 A1* | 1/2020 | Lin | H10B 10/18 |
| 2020/0043935 A1* | 2/2020 | Liaw | H10B 10/12 |
| 2020/0091162 A1* | 3/2020 | Morris | H01L 23/5226 |
| 2020/0098764 A1* | 3/2020 | Wang | H01L 21/762 |
| 2020/0106441 A1* | 4/2020 | Liaw | H03K 19/1776 |
| 2020/0126964 A1* | 4/2020 | Liaw | H10D 84/0167 |
| 2020/0135579 A1* | 4/2020 | Wu | H01L 21/76816 |
| 2020/0135724 A1* | 4/2020 | Lin | H01L 23/485 |
| 2020/0144264 A1* | 5/2020 | Li | H10D 88/00 |
| 2020/0144266 A1* | 5/2020 | Liaw | H10D 30/024 |
| 2020/0266072 A1* | 8/2020 | Lie | H01L 21/31116 |
| 2020/0365450 A1* | 11/2020 | Koh | H01L 21/76805 |
| 2021/0343700 A1* | 11/2021 | Liaw | H01L 21/76224 |
| 2021/0343712 A1* | 11/2021 | Lin | H01L 23/535 |
| 2022/0037156 A1* | 2/2022 | Chen | H01L 21/0337 |
| 2022/0173224 A1* | 6/2022 | Lin | H10D 84/038 |
| 2022/0181215 A1* | 6/2022 | Lai | H01L 21/28132 |
| 2022/0367481 A1* | 11/2022 | Yang | H10D 84/8311 |
| 2022/0367659 A1* | 11/2022 | Liaw | H10D 64/017 |
| 2023/0068794 A1* | 3/2023 | Lin | H10B 10/12 |
| 2024/0088218 A1* | 3/2024 | Koh | H10D 62/151 |

* cited by examiner

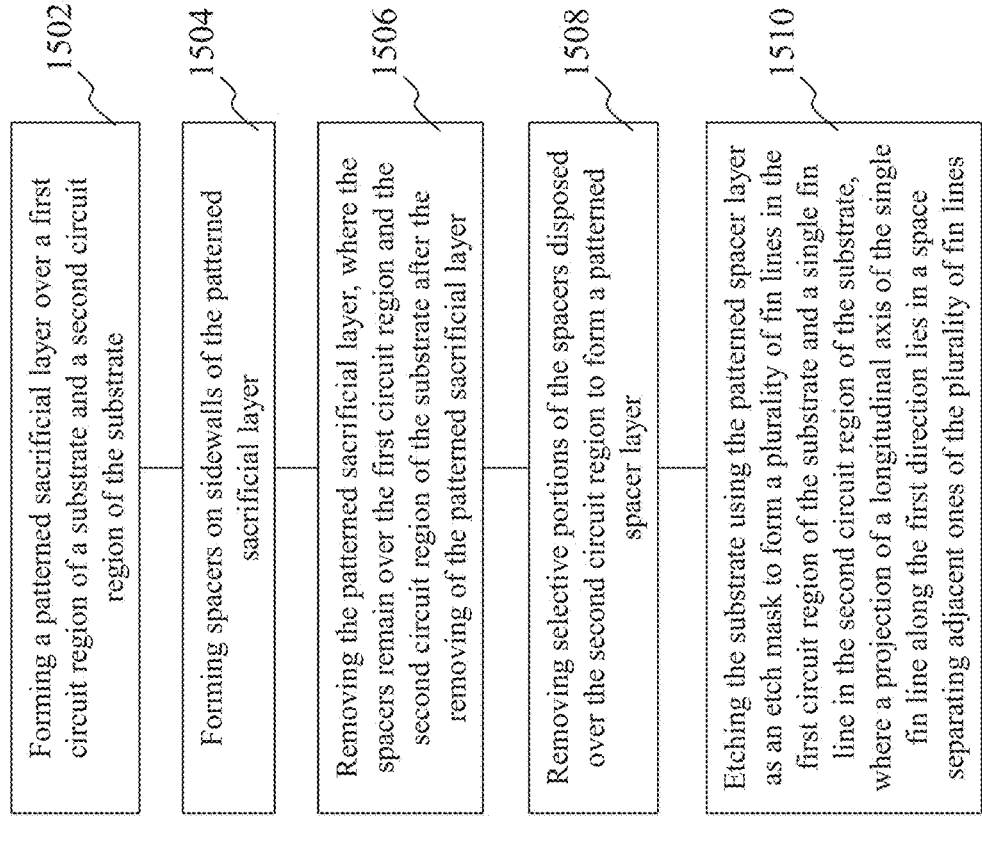

1500

1502 Forming a patterned sacrificial layer over a first circuit region of a substrate and a second circuit region of the substrate 1504 Forming spacers on sidewalls of the patterned sacrificial layer 1506 Removing the patterned sacrificial layer, where the spacers remain over the first circuit region and the second circuit region of the substrate after the removing of the patterned sacrificial layer 1508 Removing selective portions of the spacers disposed over the second circuit region to form a patterned spacer layer 1510 Etching the substrate using the patterned spacer layer as an etch mask to form a plurality of fin lines in the first circuit region of the substrate and a single fin line in the second circuit region of the substrate, where a projection of a longitudinal axis of the single fin line along the first direction lies in a space separating adjacent ones of the plurality of fin lines

FIGURE 15

INTEGRATED CIRCUIT DEVICE AND METHOD OF FORMING THE SAME

This application is a Continuation of U.S. patent application Ser. No. 17/400,965, filed Aug. 12, 2021, which is further a Divisional of U.S. patent application Ser. No. 16/415,320, filed May 17, 2019, the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component, or line, that can be created using a fabrication process) has decreased.

Despite advances in materials and fabrication techniques, scaling of planar devices, such as the metal-oxide-semiconductor field effect transistor (MOSFET) device, has proven challenging. To overcome these challenges, non-planar transistors have been developed, examples being gate-all-around (GAA) transistors and fin-like field effect transistors (Fin-FETs). Advantages of non-planar transistors include a reduction of the short channel effect, reduced leakage, and higher current flow. Notwithstanding these advantages, non-planar transistors can exhibit increased contact resistance and capacitance as feature size is reduced as technology progresses towards smaller technology nodes. Improvements in integrated circuits including non-planar transistors may be needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 15 shows a flow chart describing a method for forming fin structures in the first standard cell and the second standard cell of the array of standard cells of FIG. 1, in accordance with an embodiment.

DETAILED DESCRIPTION

Figure 1:
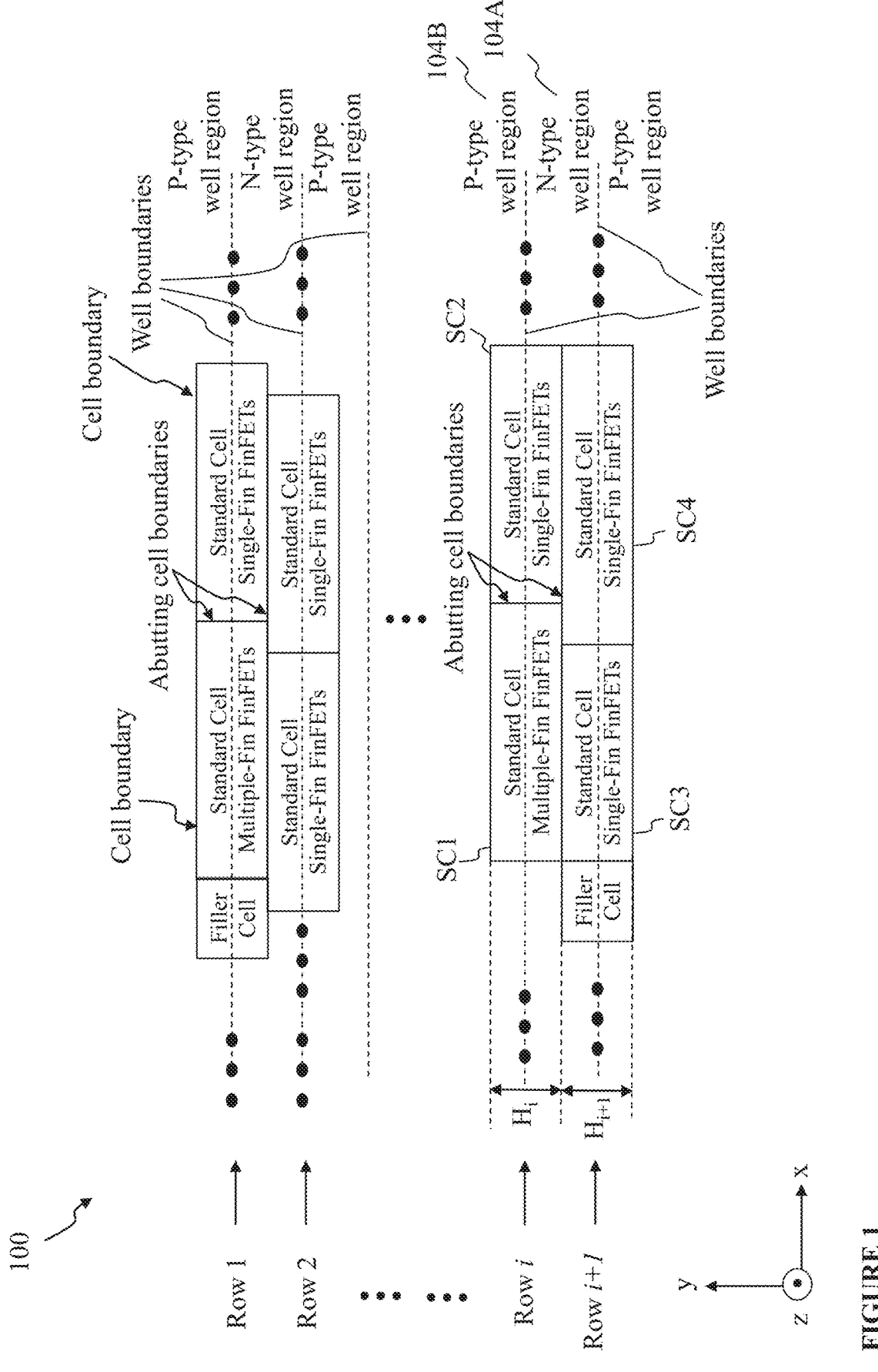
FIG. 1 shows a simplified layout of an integrated circuit that includes an array of standard cells, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

For advanced integrated circuit (IC) technology nodes, non-planar transistor devices have become a popular and promising candidate for high performance and low leakage applications, particularly for system-on-chip (SoC) products. One example of a non-planar transistor device is a fin field-effect transistor (FinFET) device. The FinFET device has an elevated channel wrapped by a gate structure on more than one side. For example, the gate structure wraps a top surface and sidewalls of a strip of semiconductor material (referred to as a "fin") extending out of a substrate from a major surface thereof. Compared to planar transistors, the FinFET device provides better control of the channel and reduces short channel effects, in particular, by reducing sub-threshold leakage (which may refer to coupling between a source and a drain of the FinFET device in the "off" state). However, as technology progresses towards smaller technology nodes (e.g. 32 nm, 28 nm, 20 nm, and smaller), there is a corresponding decrease in a width of a fin of the FinFET device (which may be needed for short channel control, for example). In some cases, the width of the fin may be decreased to be in the range of about 5 nanometers to about 20 nanometers. Such narrow fin widths place significant constraints on multi-layer interconnect features that are needed to facilitate operation of the FinFET device. For example, multi-layer interconnect features may include a contact (e.g. a slot contact) that lands on a source/drain region of the narrow fin (e.g. to physically contact the source/drain region). However, due to the reduced width of the fin, the contact-to-source/drain landing margin is degraded. Additionally, a smaller contact area is made between the contact and the source/drain region of the narrow fin (e.g. compared to a planar transistor or another FinFET device with a fin having a width greater than the aforementioned range). The smaller contact area results in increased contact resistance and increased contact capacitance.

The present disclosure aims to circumvent the above-described drawbacks that accompany the decrease in feature size. For example, the present disclosure proposes a layout for a first standard cell (having one or more multiple-fin FinFET device) and a second standard cell (having one or more single-fin FinFET device) that are located adjacent to each other along a row of an array of standard cells. In the proposed layout, a single-fin structure of the second standard cell is positioned such that the longitudinal axis of the single-fin structure, when projected from the second standard cell to the first standard cell, lies in a space that separates adjacent fin structures of a multiple-fin FinFET device of the first standard cell. The proposed layout alleviates constraints on the source/drain landing margin for the single-fin FinFET devices of the second standard cell and aligns the single-fin structures of the second standard cell to a center region of contacts (e.g. slot contacts) that land on and contact the drain features of the single-fin FinFET devices of the second standard cell, which, in turn, decreases contact resistance and contact capacitance. While the present disclosure spatial and positional features of fin structures of FinFET devices, it is noted that the spatial and positional features described herein are also applicable to other non-planar transistor devices (e.g. gate-all-around transistor devices).

FIG. 1 shows a simplified layout of an integrated circuit device 100 that includes an array of standard cells, in accordance with an embodiment. In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (e.g. such as a NAND gate). Cell-based methodology—the general class to which standard cells belong—makes it possible for one designer to focus on the high-level (logical function) aspect of digital design, while another designer focuses on the implementation (physical) aspect. Along with semiconductor manufacturing advances, standard cell methodology has helped designers scale ASICs from comparatively simple single-function ICs (of several thousand gates), to complex multi-million gate system-on-a-chip (SoC) devices. In various examples, a standard cell (e.g. which may be referred to as a functional cell, a functional logic cell, and/or a circuit region) may include a group of transistors and interconnect structures that may implement a circuit, for example, a circuit providing a Boolean logic function (e.g. AND, OR, XOR, XNOR, NAND, NOR, inverters, etc.) or a storage function (e.g. flip-flop or latch). The simplest standard cells are direct representations of the elemental NAND, NOR, and XOR Boolean function, although cells of much greater complexity are commonly used (e.g. such as a 2-bit full-adder, or muxed D-input flip-flop).

The array of standard cells may be arranged in rows, with each row including a plurality of standard cells. Each standard cell is demarcated or delineated by a cell boundary, as illustrated in FIG. 1, and adjacent standard cells in a given row may have cell boundaries that abut each other. Additionally, as illustrated in FIG. 1, standard cells in adjacent rows may have cell boundaries that abut each other. As discussed above, each standard cell may include a group of transistors and interconnect structures that may implement a circuit (e.g. providing a Boolean logic function or a storage function). To implement such functionality, the standard cells may each include complementary metal-oxide-semiconductor field-effect transistors (CMOSFETs) having one or more P-type MOSFETs (PMOSFETs) formed in an N-type well region as well as one or more N-type MOSFETs (NMOSFETs) formed in a P-type well region. The N-type well regions, the P-type well regions, and the boundaries therebetween are shown in FIG. 1. In an embodiment, each of the one or more PMOSFETs and the one or more NMOSFETs of a standard cell may be implemented using a FinFET device.

As shown in FIG. 1, a row of the array of standard cells (e.g. Row i of FIG. 1) includes a first standard cell SC1 and a second standard cell SC2, which are adjacent to (e.g. immediately adjacent to) each other in a first direction (e.g. an x-direction). The first standard cell SC1 differs from the second standard cell SC2 in that the first standard cell SC1 includes one or more multiple-fin FinFET devices, while the second standard cell SC2 includes one or more single-fin FinFET devices. A multiple-fin FinFET device may be a FinFET device that includes two or more semiconductor fins, where a gate structure (that is common to the two or more semiconductor fins) controls current flow in channel regions disposed in the two or more semiconductor fins. On the other hand, a single-fin FinFET device may be a FinFET device that includes no more than one semiconductor fin, where a gate structure (which may be different from the gate structure of the multiple-fin FinFET device) engages the one semiconductor fin and controls current flow in a channel region disposed in the one semiconductor fin. Consequently, Row i of FIG. 1 may be a row of the array that includes a standard cell including one or more multiple-fin FinFET devices (e.g. first standard cell SC1) that is adjacent to another standard cell including one or more single-fin Fin-FET devices (e.g. second standard cell SC2). These features of first and second standard cells SC1, SC2 are illustrated and explained in greater detail in FIGS. 2A, 2B, 3, 4, 5A, 5B, 6A, and 6B. In an embodiment, the first standard cell SC1 may be used for high speed applications since it includes FinFET devices having multiple-fins. The second standard cell SC2, conversely, may be used for low leakage and low power (e.g. low active power and/or low standby power)

applications since it includes FinFET devices having a single-fin. Consequently, the integrated circuit device 100, having both multiple-fin FinFET devices and single-fin FinFET devices, may be used for both high performance and low leakage applications, particularly for SoC products.

Figure 2A:
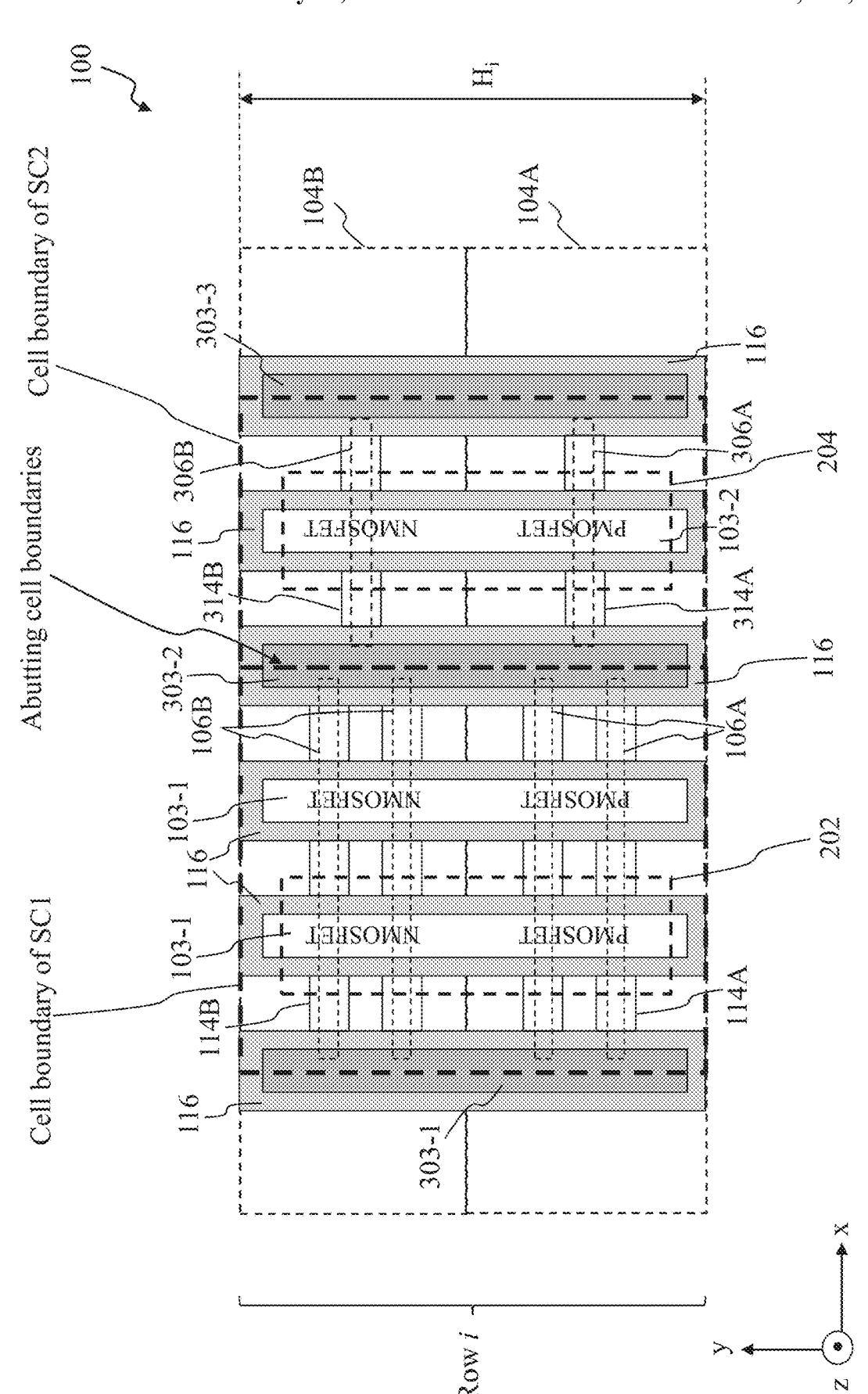
FIG. 2A shows a simplified top-down schematic view of a first standard cell and a second standard cell of the array of standard cells of FIG. 1, in accordance with an embodiment.

FIG. 2A shows a simplified top-down schematic view of the first standard cell SC1 and the second standard cell SC2 of FIG. 1, in accordance with an embodiment. FIG. 2A illustrates the cell boundaries of the first and second standard cells SC1, SC2. FIG. 2A also illustrates isolation structures 303-1, 303-2, 303-3 (e.g. implemented using dielectric gates) that are disposed on the boundaries of the first and second standard cells SC1, SC2 to isolate the first and second standard cells SC1, SC2 from each other and from other standard cells of the Row i. As an example, the first and second standard cells SC1, SC2 are isolated from each other by the isolation structure 303-2. The isolation structures 303-1, 303-2, 303-3 may include a dielectric material such as silicon oxide or silicon nitride, as examples.

Standard cells of the Row i may have a dimension $H_i$ (e.g. a cell height), measured in a second direction (e.g. a y-direction) that is substantially perpendicular to the first direction. The dimension $H_i$ may be indicative of (e.g. equal to) a distance between opposing boundaries of the cells of the Row i. The dimension $H_i$ may be in a range of about 50 nanometers and about 400 nanometers.

As discussed above, the standard cells include CMOS-FETs, which may be implemented using FinFET devices. Consequently, as seen in FIG. 2A, the first standard cell SC1 includes fin structures 106A, 106B that are oriented or routed along the first direction (e.g. the x-direction), while the second standard cell SC2 includes fin structures 306A, 306B that are also oriented or routed along the first direction. Stated differently, the longitudinal axes of the fin structures 106A, 306A, 106B, 306B are oriented along the first direction. The longitudinal axes of the fin structures 106A, 306A, 106B, 306B may, as an example, be in a direction of a current flow between source/drain features of the fin structures 106A, 306A, 106B, 306B, respectively.

Figure 3:
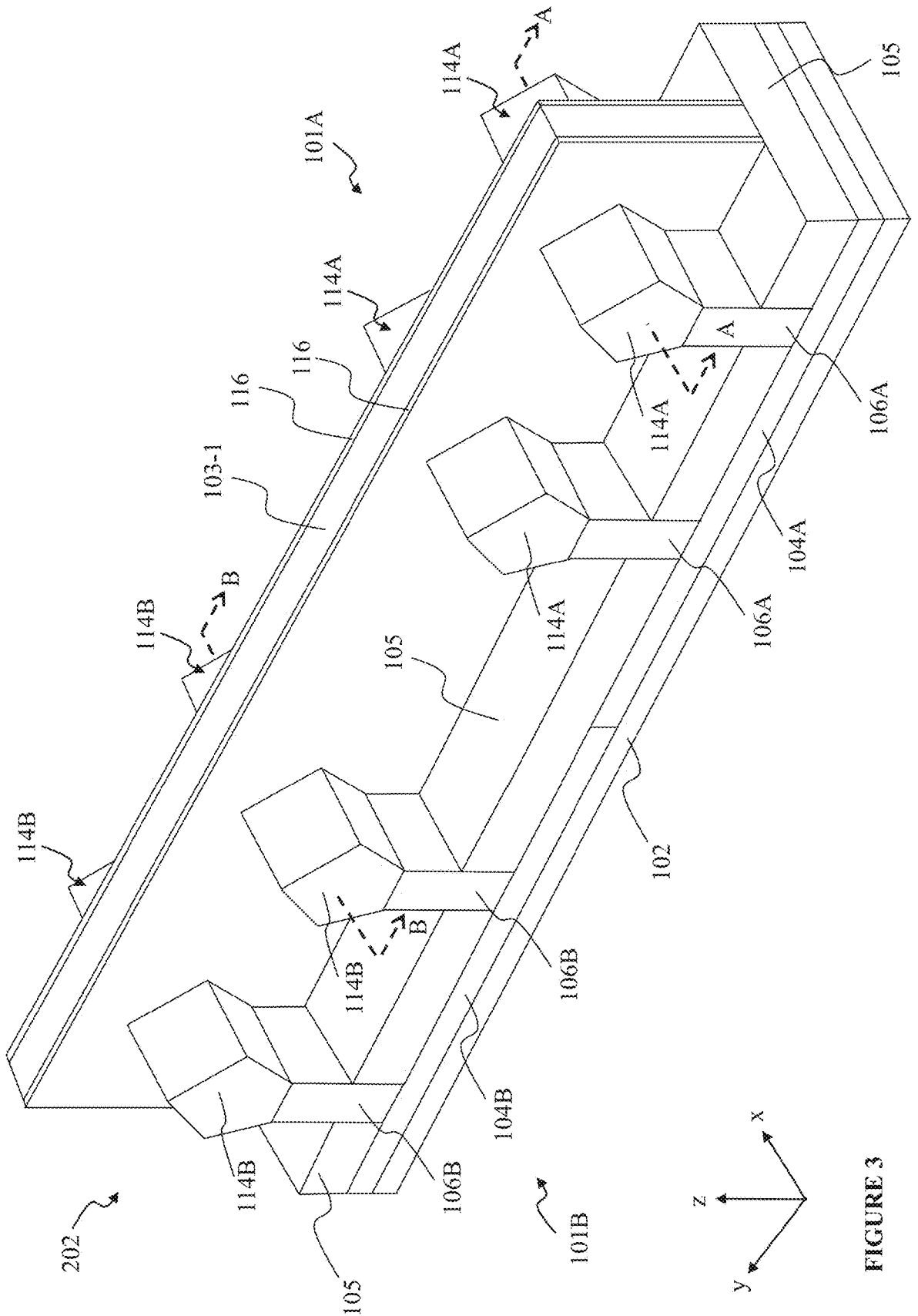
FIG. 3 shows a simplified perspective view of a portion of the first standard cell shown in FIG. 2A, in accordance with an embodiment.

FIG. 3 shows a simplified perspective view of a portion 202 of the first standard cell SC1 shown in FIG. 2A, in accordance with an embodiment. As illustrated in FIG. 3, the first standard cell SC1 includes a first FinFET device 101A and a second FinFET device 101B. The first and second FinFET devices 101A, 101B have opposite conductivity-types and are each multiple-fin FinFET devices. As an example, the first FinFET device 101A may be a single transistor that includes a plurality of fins (e.g. fin structures 106A), and a first gate structure 103-1 engages the plurality of fins of the first FinFET device 101A. The first gate structure 103-1 is a functional gate structure that enables current to flow between source/drain regions of the plurality of fins of the first FinFET device 101A. Similarly, the second FinFET device 101B may be a single transistor that includes a plurality of fins (e.g. fin structures 106B), and the first gate structure 103-1 engages the plurality of fins of the second FinFET device 101B. In the example of FIG. 3, each of the first and second FinFET devices 101A, 101B includes two fins; however, the multiple-fin FinFET devices of the first standard cell SC1 may include more than two fins in other embodiments. Furthermore, as illustrated in FIGS. 2A and 3, the first gate structure 103-1 is oriented along the second direction (e.g. the y-direction). Stated differently, a longitudinal axis of the first gate structure 103-1 may be oriented along the second direction, while a transverse axis of the first gate structure 103-1 may be oriented along the first direction. It is noted that the transverse axes of the fin structures 106A, 306A, 106B, 306B may be oriented along the second direction.

Figure 5A:
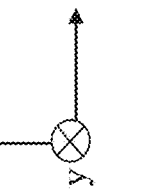
FIGS. 5A and 5B show cross-sectional views of fin structures of the first standard cell shown in FIG. 3, in accordance with an embodiment.
Figure 5B:
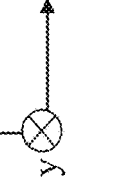

FIG. 3 also illustrates a line A-A and a line B-B along which cross-sectional views of the first standard cell SC1 are taken. The cross-sectional view along the line A-A is illustrated in FIG. 5A, and the cross-sectional view along the line B-B is illustrated in FIG. 5B. It is noted that the cross-sectional view along the line A-A is along the longitudinal axis of a fin structure 106A of the first FinFET device 101A. In like manner, the cross-sectional view along the line B-B is along the longitudinal axis of a fin structure 106B of the second FinFET device 101B.

Figure 4:
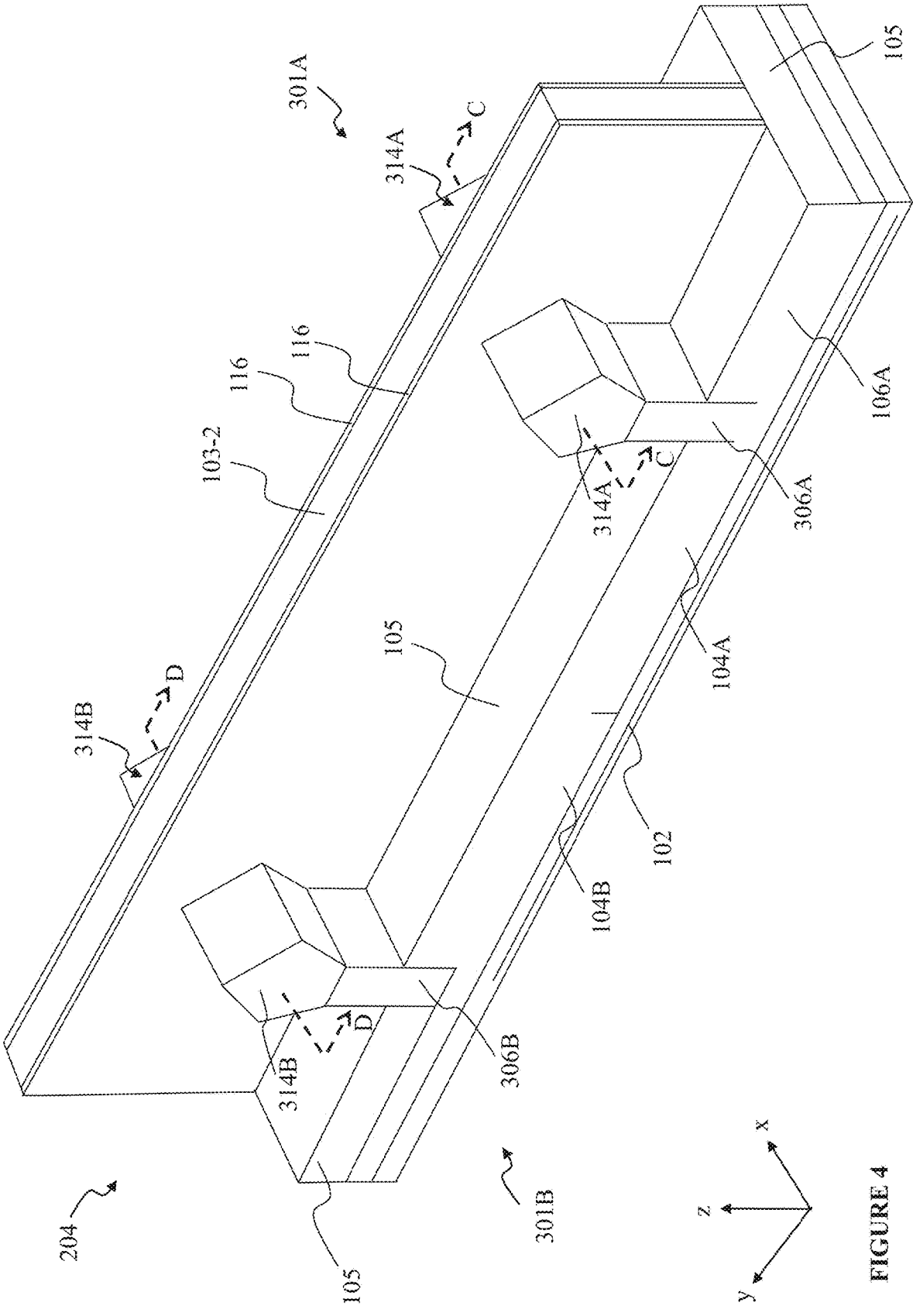
FIG. 4 shows a simplified perspective view of a portion of the second standard cell shown in FIG. 2A, in accordance with an embodiment.

FIG. 4 shows a simplified perspective view of a portion 204 of the second standard cell SC2 shown in FIG. 2A, in accordance with an embodiment. As illustrated in FIG. 4, the second standard cell SC2 includes a third FinFET device 301A and a fourth FinFET device 301B. The third and fourth FinFET devices 301A, 301B have opposite conductivity-types. The third FinFET device 301A has the same conductivity-type as the first FinFET device 101A, while the fourth FinFET device 301B has the same conductivity-type as the second FinFET device 101B. In contrast to the first and second FinFET devices 101A, 101B of the first standard cell SC1, each of the third and fourth FinFET devices 301A, 301B is a single-fin FinFET device. As an example, each of the third and fourth FinFET devices 301A, 301B respectively includes one fin, and a second gate structure 103-2 engages the one fin of each of the third and fourth FinFET devices 301A, 301B. The second gate structure 103-2 is a functional gate structure that enables current to flow between source/drain regions of the third FinFET device 301A and a current to flow between source/drain regions of the fourth FinFET device 301B. As illustrated in FIGS. 2A and 4, the second gate structure 103-2 is oriented along the second direction (i.e., the longitudinal axis of the second gate structure 103-2 is oriented along the second direction).

Figure 6A:
FIGS. 6A and 6B show cross-sectional views of fin structures of the second standard cell shown in FIG. 4, in accordance with an embodiment.
Figure 6B:

FIG. 4 also illustrates a line C-C and a line D-D along which cross-sectional views of the second standard cell SC2 are taken. The cross-sectional view along the line C-C is illustrated in FIG. 6A, and the cross-sectional view along the line D-D is illustrated in FIG. 6B. It is noted that the cross-sectional view along the line C-C is along the longitudinal axis of a fin structure 306A of the third FinFET device 301A, while the cross-sectional view along the line D-D is along the longitudinal axis of a fin structure 306B of the fourth FinFET device 301B. Features that are common to the first standard cell SC1 and the second standard cell SC2 are denoted using similar reference numerals for the sake of clarity and simplicity.

FIGS. 3, 4, 5A, 5B, 6A, and 6B illustrate that the integrated circuit device 100 includes a substrate 102. The substrate 102 may be a semiconductor substrate, such as a bulk semiconductor, a semiconductor-on-insulator (SOI) substrate, or the like, which may be doped (e.g. with a P-type or an N-type dopant) or undoped. The substrate 102 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. The semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

The substrate 102 includes various doped regions configured according to design requirements of the integrated circuit device 100. For example, the substrate 102 may include P-type doped regions (for example, P-type wells) doped with P-type dopants, such as boron (for example, $BF_2$), indium, other P-type dopants, or combinations thereof. Additionally or alternatively, the substrate 102 may include N-type doped regions (for example, N-type wells) doped with N-type dopants, such as phosphorus, arsenic, other N-type dopants, or combinations thereof. The various doped regions can be formed directly on and/or in the substrate 102, for example, providing a P-well structure, an N-well structure, a dual-well structure, a raised structure, or combinations thereof. An ion implantation process, a diffusion process, or other suitable doping process can be performed either individually or in combination to form the various doped regions. In the embodiments shown in FIGS. 1, 2A, 3, 4, 5A, 5B, 6A, and 6B, the various doped regions of the substrate 102 are depicted as a first region 104A and a second region 104B that is adjacent to the first region 104A along the second direction.

The first region 104A may be an N-well region for forming P-type devices therein or thereon, such as the first FinFET device 101A and the third FinFET device 301A. The second region 104B may be a P-well region for forming N-type devices therein or thereon, such as the second FinFET device 101B and the fourth FinFET device 301B. In some embodiments, the first region 104A has an N-type dopant concentration of about $1 \times 10^{16}$ cm$^{-3}$ to about $5 \times 10^{19}$ cm$^{-3}$, while the second region 104B has a P-type dopant concentration of about $1 \times 10^{16}$ cm$^{-3}$ to about $5 \times 10^{19}$ cm$^{-3}$.

A first plurality of fin structures 106A and a first single-fin structure 306A protrude out of the first region 104A. For example, the first plurality of fin structures 106A and the first single-fin structure 306A protrude from a major surface of the first region 104A in a third direction (e.g. a z-direction). In the examples depicted in the Figures, the major surface of the first region 104A may refer to the planar surface of the first region 104A that lies in an x-y plane. The first plurality of fin structures 106A and the first single-fin structure 306A may have a conductivity-type that is different from the conductivity-type of the first region 104A.

A second plurality of fin structures 106B and a second single-fin structure 306B protrude out of the second region 104B. For example, the second plurality of fin structures 106B and the second single-fin structure 306B protrude from a major surface of the second region 104B in the third direction. As with the first region 104A, the major surface of the second region 104B may refer to the planar surface of the second region 104B that lies in an x-y plane. The second plurality of fin structures 106B and the second single-fin structure 306B may have a conductivity-type that is different from the conductivity-type of the second region 104B. As an example, in embodiments where the first region 104A is an N-type well region and the second region 104B is a P-type well region, the first plurality of fin structures 106A and the first single-fin structure 306A may have a P-type conductivity, while the second plurality of fin structures 106B and the second single-fin structure 306B may have an N-type conductivity.

Figure 2B:
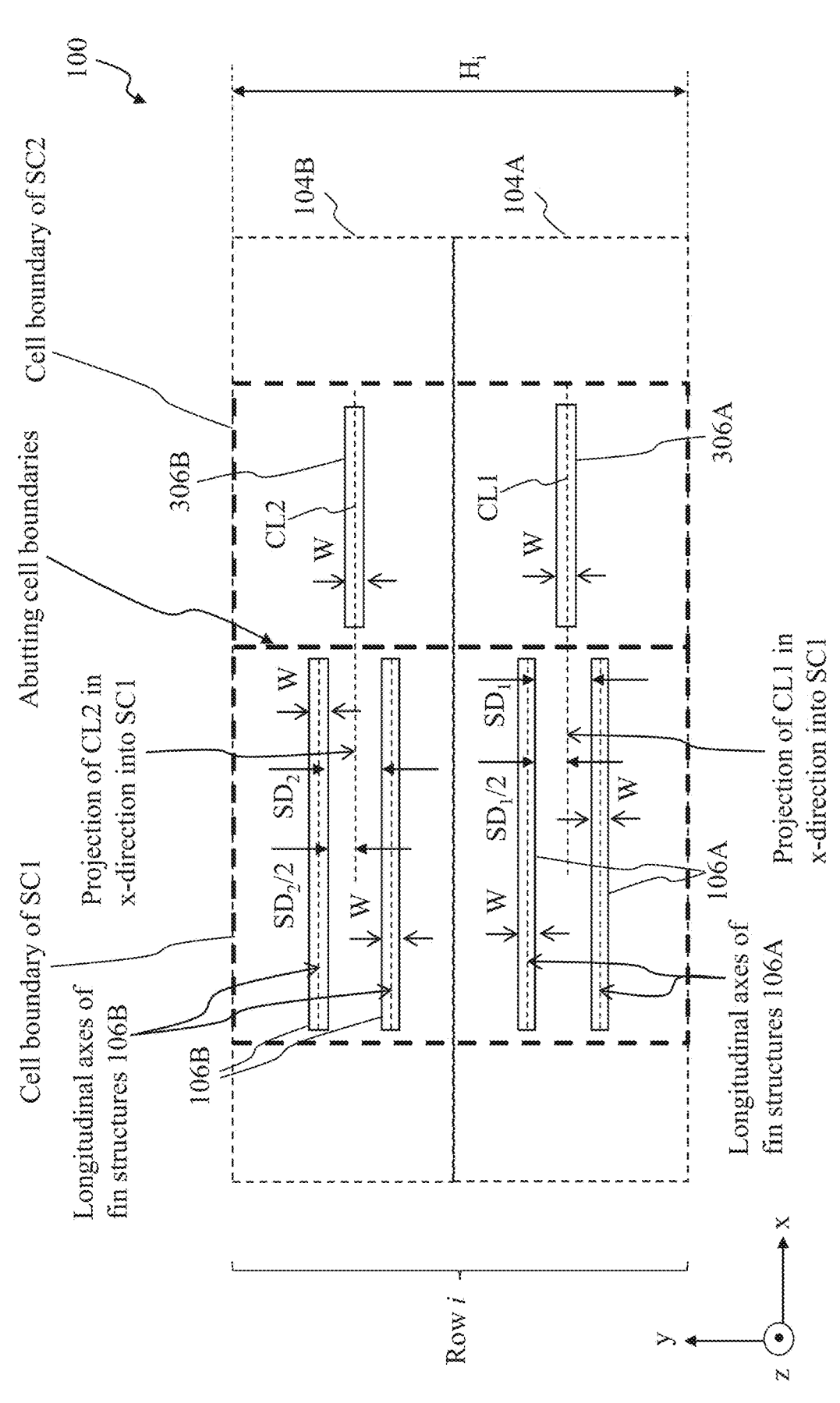
FIG. 2B shows a simplified top-down schematic view of fin structures located within boundaries of the first standard cell and the second standard cell of FIG. 2A, in accordance with an embodiment.

FIG. 2B shows a further simplified top-down schematic view of the fin structures 106A, 106B, 306A, 306B, in accordance with an embodiment. It is noted that the fin structures 106A, 106B, 306A, 306B in FIG. 2B are the same as the fin structures fin structures 106A, 106B, 306A, 306B in FIG. 2A, except that structures (e.g. gate structures 103-1, 103-2 and dielectric gates 303-1, 303-2, 303-3) that overlie the fin structures 106A, 106B, 306A, 306B are omitted so that spatial characteristics of the fin structures 106A, 106B, 306A, 306B may be highlighted with ease. Each of the fin structures 106A, 106B, 306A, 306B may have a dimension W (e.g. measured along the transverse axis of each of the fin structures and in a channel region thereof) that is in a range of about 3 nanometers to about 15 nanometers. With regards to the fin structures 106A that extend out of the first region 104A, adjacent fin structures of the first plurality of fin structures 106A are separated from each other in the second direction (e.g. the y-direction) by a space. The adjacent fin structures are separated from each other by a first separation distance $SD_1$ measured in the second direction, as illustrated in FIG. 2B. The first separation distance $SD_1$ may be in a range of about 10 nanometers to about 40 nanometers, while the pitch of the first plurality of fin structures 106A (e.g. distance, measured in the second direction, between longitudinal axes of immediately adjacent fin structures) may be in a range of about 15 nanometers to about 50 nanometers. The first single-fin structure 306A (which also extends out of the first region 104A) is located outside of the space that separates the adjacent fin structures of the first plurality of fin structures 106A (e.g. since the first single-fin structure 306A is a fin structure of the second standard cell SC2 and the first plurality of fin structures 106A are fin structures of the first standard cell SC1). However, as illustrated in FIG. 2B, the first single-fin structure 306A is offset in the second direction with respect to the fin structures of the first plurality of fin structures 106A. For example, a center-axis CL1 (e.g. the longitudinal axis) of the first single-fin structure 306A, when projected in the first direction from the second standard cell SC2 to the first standard cell SC1, lies within the space that separates the adjacent fin structures of the first plurality of fin structures 106A. Stated differently, the first plurality of fin structures 106A and the first single-fin structure 306A extend longitudinally along the first direction (e.g. the x-direction), but an entirety of the first single-fin structure 306A is located outside of a space that separates adjacent fin structures of the first plurality of fin structures 106A in the second direction (e.g. the y-direction) such that a projection of the longitudinal axis of the first single-fin structure 306A in the first direction (e.g. the extension of the longitudinal axis of the first single-fin structure 306A along the x-direction) lies within the space separating adjacent fin structures of the first plurality of fin structures 106A instead of coinciding with the longitudinal axis of any fin structure of the first plurality of fin structures 106A. In some embodiments, such as in the example shown in FIG. 2B, the projection of the center-axis CL1 into the first standard cell SC1 may lie in the middle of the space separating the adjacent fin structures of the first plurality of fin structures 106A. In other words, a distance between the projection of the center-axis CL1 of the first single-fin structure 306A and an adjacent fin structure of the first plurality of fin structures 106A may be about half the first separation distance $SD_1$.

Similar spatial characteristics are observed between the second plurality of fin structures 106B and the second single-fin structure 306B. For example, adjacent fin structures of the second plurality of fin structures 106B are separated from each other in the second direction (e.g. the y-direction) by a space. The adjacent fin structures are separated from each other by a second separation distance $SD_2$ measured in the second direction. The second separation distance $SD_2$ may be a value falling within a range of values similar to that of the first separation distance $SD_1$. The second separation distance $SD_2$ may be equal to the first separation distance $SD_1$ in some embodiments but may be different from the first separation distance $SD_1$ in other embodiments. The second single-fin structure 306B (which also extends out of the second region 104B) is located outside of the space that separates the adjacent fin structures of the second plurality of fin structures 106B. However, as illustrated in FIG. 2B, the second single-fin structure 306B is offset in the second direction with respect to the fin structures of the second plurality of fin structures 106B. For example, a center-axis CL2 (e.g. the longitudinal axis) of the second single-fin structure 306B, when projected in the first direction from the second standard cell SC2 to the first standard cell SC1, lies within the space that separates the adjacent fin structures of the second plurality of fin structures 106B. Stated differently, the second plurality of fin structures 106B and the second single-fin structure 306B extend longitudinally along the first direction (e.g. the x-direction), but an entirety of the second single-fin structure 306B is located outside of a space that separates adjacent fin structures of the second plurality of fin structures 106B in the second direction (e.g. the y-direction) such that a projection of the longitudinal axis of the second single-fin structure 306B in the first direction (e.g. the x-direction) lies within the space separating adjacent fin structures of the second plurality of fin structures 106B instead of coinciding with the longitudinal axis of any fin structure of the second plurality of fin structures 106B. In some embodiments, such as in the example shown in FIG. 2B, the projection of the center-axis CL2 into the first standard cell SC1 may also lie in the middle of the space separating the adjacent fin structures of the second plurality of fin structures 106B (e.g. a distance between the projection of the center-axis CL2 of the second single-fin structure 306B and an adjacent fin structure of the second plurality of fin structures 106B may be about half the second separation distance $SD_2$).

A method used for forming the first and second pluralities of fin structures 106A, 106B and the first and second single-fin structures 306A, 306B having the above-described spatial characteristics is discussed below in greater detail in reference to FIGS. 13A to 13J and 14A to 14J. Furthermore, it is noted that in typical standard cells, a fin structure of a standard cell may be aligned with a fin structure of an adjacent standard cell such that the longitudinal axis of the fin structure of one standard cell coincides with the longitudinal axis of the fin structure of an immediately adjacent standard cell. In the example of FIG. 2B, however, since a fin structure of a standard cell is offset (e.g. in the transverse direction of the fin structure) with respect to a fin structure of an adjacent standard cell, the longitudinal axes of the fin structures of the standard cells do not coincide. Instead, the longitudinal axis of the single-fin structure is parallel to the longitudinal axes of the multiple-fin structures of the adjacent standard cell and lies within the space separating adjacent ones of the multiple-fin structures. This spatial relationship between the multiple-fin FinFET devices 101A 101B of the first standard cell SC1 and the single-fin FinFET devices 301A, 301B of the second standard cell SC2 alleviates constraints on the source/drain landing margin for the single-fin FinFET devices 301A, 301B and aligns the fin structures 306A, 306B to a center region of contacts (e.g. slot contacts) that land on and contact the drain features of the single-fin FinFET devices 301A, 301B, which, in turn, decreases contact resistance and contact capacitance. This feature of the position of the single-fin structures 306A, 306B in relation to contacts that land on and contact the drain features is shown and described in greater detail below in reference to FIG. 7.

Referring to FIGS. 3 and 4, isolation regions 105, such shallow trench isolation (STI) regions, may be formed over the first region 104A and the second region 104B. The isolation regions 105 are formed to laterally surround or encapsulate a lower portion of the fin structures 106A, 106B, 306A, 306B while leaving an upper portion of the fin structures 106A, 106B, 306A, 306B above the isolation regions 105. In an embodiment, the isolation regions 105 may be formed by depositing a suitable dielectric material (e.g. using CVD, PECVD, or flowable CVD (FCVD)) and etching the dielectric material to expose the upper portion of the fin structures 106A, 106B, 306A, 306B. The etching process may be a dry etching process using an etching gas including ammonia (e.g. $NH_3$) and hydrogen fluoride (HF). The isolation regions 105 may include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). The isolation region 105 may include a dielectric layer disposed over a doped liner layer (including, for example, boron silicate glass (BSG) or phosphosilicate glass (PSG)).

The first gate structure 103-1 and the second gate structure 103-2 may be formed using a gate-last process (sometimes referred to as a replacement gate process). However, in other embodiments, the gate structures 103-1, 103-2 may be formed using a gate-first process. In embodiments that use a replacement gate process to form the first and second gate structures 103-1, 103-2, a first dummy gate structure may be formed over a region of the fin structures 106A, 106B, thereby defining or demarcating a channel region and source/drain regions for each of the fin structures 106A, 106B. FIG. 5A shows an example where a channel region 112A of the fin structure 106A is disposed between source/drain regions 110A of the fin structure 106A. Similarly, in FIG. 5B, a channel region 112B of the fin structure 106B is disposed between source/drain regions 110B of the fin structure 106B. As an example, the region of the fin structures 106A, 106B over which the first dummy gate structure is disposed may subsequently form the respective channel regions 112A, 112B of the fin structures 106A, 106B, while the regions of the fin structures 106A, 106B that are free from the first dummy gate structure may form respective source/drain regions 110A, 110B of the fin structures 106A, 106B.

In like manner, a second dummy gate structure may also be formed over a region of the single-fin structures 306A, 306B, thereby defining or demarcating a channel region and source/drain regions for each of the single-fin structures 306A, 306B. FIG. 6A shows an example where a channel region 312A of the single-fin structure 306A is disposed between source/drain regions 310A of the single-fin structure 306A. Similarly, in FIG. 6B, a channel region 312B of the single-fin structure 306B is disposed between source/drain regions 310B of the fin structure 306B. The region of the single-fin structures 306A, 306B over which the second dummy gate structure is disposed may subsequently form the respective channel regions 312A, 312B of the single-fin structures 306A, 306B, while the regions of single-fin structures 306A, 306B that are free from the second dummy gate structure may form respective source/drain regions 310A, 310B of the single-fin structures 306A, 306B.

Lightly doped drain (LDD) regions 108A, 108B, 308A, 308B may be respectively formed in the fin structures 106A, 106B, 306A, 306B, as illustrated in FIGS. 5A, 5B, 6A, and 6B. For example, the LDD regions 108A, 308A may be respectively formed in the source/drain regions 110A, 310A of the fin structures 106A, 306A, with such LDD regions 108A, 308A being respectively positioned adjacent to the channel regions 112A, 312A of the fin structures 106A, 306A. Similarly, the LDD regions 108B, 308B may be respectively formed in the source/drain regions 110B, 310B of the fin structures 106B, 306B, with such LDD regions 108B, 308B being respectively positioned adjacent to the channel regions 112B, 312B of the fin structures 106B, 306B. In embodiments where the P-type FinFET devices 101A, 301A include a silicon germanium (SiGe) channel region 112A, 312A, a germanium atomic concentration may be within a range of about 5 percent and about 50 percent (e.g. between about 10 percent and 40 percent).

In an embodiment, the LDD regions 108A, 108B, 308A, 308B may be formed using a plasma doping process. As an example, in a replacement gate process, the plasma doping process may implant P-type impurities (e.g. for P-type devices) in the fin structures 106A, 306A to respectively form the LDD regions 108A, 308A. The plasma doping process may additionally or alternatively implant N-type impurities (e.g. for N-type devices) in the fin structures 106B, 306B to respectively form the LDD regions 108B, 308B. The plasma doping process may use a doping mask that includes the dummy gate structures and one or more patterned mask layers. Illustratively, a patterned mask layer may be formed to shield the second region 104B (e.g. the P-well region) and the fin structures 106B, 306B so that P-type impurities may be implanted into the source/drain regions 110A of the fin structures 106A and the source/drain regions 310A of the single-fin structure 306A, thereby forming the LDD regions 108A of the fin structures 106A and the LDD regions 308A of the single-fin structure 306A. Another patterned mask layer may be formed to shield the first region 104A (e.g. the N-well region) and the fin structures 106A, 306A so that N-type impurities may be implanted into the source/drain regions 110B of the fin structures 106B and the source/drain regions 310B of the single-fin structure 306B, thereby forming the LDD regions 108B of the fin structures 106B and the LDD regions 308B of the single-fin structure 306B. In some embodiments, the P-doped LDD regions 108A, 308A may have a dopant concentration of about $1 \times 10^{17}$ cm$^{-3}$ to about $5 \times 10^{21}$ cm$^{-3}$, while the N-doped LDD regions 108B, 308B may have a dopant concentration of about $1 \times 10^{17}$ cm$^{-3}$ to about $5 \times 10^{21}$ cm$^{-3}$.

Subsequent to forming the LDD regions 108A, 108B, 308A, 308B, gate spacers 116 may be formed on opposite sidewalls of the first and second dummy gate structures (e.g. in embodiments that use a gate replacement process). The gate spacers 116 also extend over the top surfaces of the fin structures 106A, 106B, 306A, 306B. The gate spacers 116 may be a single layer or a multi-layer structure. In an embodiment, the gate spacers 116 include a low-k (e.g. k<7) dielectric material. The gate spacers 116 may include an oxide of silicon (e.g. SiO$_2$), a nitride of silicon (e.g. Si$_3$N$_4$), another dielectric material (e.g. silicon carbide, silicon carbonitride), or combination thereof (e.g. silicon oxynitride). The examples of FIGS. 5A, 5B, 6A, and 6B show an example where the gate spacers 116 include a first gate spacer layer 118 and a second gate spacer layer 120 disposed on the first gate spacer 118. The first gate spacer layer 118 (e.g. an SiO$_2$ layer having a uniform thickness) may be formed using, e.g. a thermal oxidation, chemical vapor deposition (CVD), or other suitable deposition process. The second gate spacer layer 120 may be formed of silicon nitride, silicon carbonitride, a combination thereof, or the like using a suitable deposition method. The second gate spacer layer 120 may be formed as a main D-shaped spacer over the first dielectric layer 118, with the second gate spacer layer 120 being subsequently exposed to an anisotropic etch process to remove portions of the gate spacer layers 118, 120 to form the gate spacers 116.

FIG. 5A also shows source/drain features 114A that are formed in the source/drain regions 110A of the fin structures 106A, in accordance with an embodiment. FIG. 5B shows source/drain features 114B that are formed in the source/drain regions 110B of the fin structures 106B, in accordance with an embodiment. The source/drain features 114A may be formed by etching the LDD regions 110A within the fin structures 114A to form recesses, and epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The source/drain features 114B may be formed in the fin structures 106B using similar processes. FIG. 6A shows source/drain features 314A that are formed in the source/drain regions 310A of the single-fin structure 306A, and FIG. 6B shows source/drain features 314B that are formed in the source/drain regions 310B of the single-fin structure 306B. The source/drain features 314A, 314B may be respectively formed in the single-fin structures 306A, 306B using similar processes.

The source/drain features 114A, 314A may be P-type features and include silicon, germanium, silicon germanium (SiGe), silicon germanium carbon (SiGeC), or a combination thereof as well as a P-type impurity such as boron or indium. The source/drain features 114A, 314A may have a P-type dopant concentration of about $1 \times 10^{19}$ cm$^{-3}$ to about $6 \times 10^{21}$ cm$^{-3}$. The source/drain features 114B, 314B may be N-type features and include silicon, silicon carbide (SiC), silicon phosphorous (SiP), phosphorous-doped silicon carbon (SiCP), the like, or a combination thereof. The source/drain features 114B, 314B may have an N-type dopant concentration of about $1 \times 10^{19}$ cm$^{-3}$ to about $5 \times 10^{22}$ cm$^{-3}$.

A height of each of the fin structures 106A, 106B, 306A, 306B may, as an example, include a total fin height FH and a channel region height CH, measured in the third direction (e.g. z-direction), as illustrated in FIGS. 5A, 5B 6A, and 6B. In an embodiment, the total fin height FH may be in a range of about 60 nanometers to about 300 nanometers, while the channel region height CH may be in a range of about 30 nanometers and 80 nanometers.

An etch stop layer (ESL) 122 may be formed on surfaces of the source/drain features 114A, 114B, 314A, 314B directed away from the substrate 102. As an example, the ESL 122 may be formed on upward-facing surfaces of the source/drain features 114A, 114B, 314A, 314B using, for example, a plasma-enhanced CVD (PECVD) process and/or other suitable deposition or oxidation processes. The ESL 122 may include a dielectric material such as silicon nitride (Si$_3$N$_4$), silicon oxide (SiO$_2$), silicon oxynitride (SiON), and/or other materials.

A first dielectric layer 124 (e.g. an interlayer dielectric (ILD) layer) may be formed over the fin structures 106A, 106B, 306A, 306B and over the ESL 122, as shown in the examples of FIGS. 5A, 5B, 6A, and 6B. The first dielectric layer 124 may be formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

In some embodiments, a replacement gate process is subsequently performed. In such a process, the above-mentioned first and second dummy gate structures are removed (e.g. using an etching process) to form a recess between the gate spacers 116. The recess is subsequently filled with suitable material layers, which are planarized to form the first gate structure 103-1 and the second gate structure 103-2. As illustrated in FIGS. 5A, 5B, 6A, and 6B, the first and second gate structures 103-1, 103-2 includes a gate dielectric layer 126, a barrier layer 128, a seed layer 130, and a gate electrode 132. The gate dielectric layer 126 may include silicon oxide, silicon nitride, or a high-k dielectric material (e.g. k>7.0) including a metal oxide or a silicate of Hf, Al, Zr, La, Mg, Y, Sr, Ba, Ti, Pb, or a combination thereof. As an example, the gate dielectric layer 126 may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$). The gate dielectric layer 126 may, as an example, be formed using molecular beam deposition (MBD), atomic layer deposition (ALD), PECVD, and the like.

The barrier layer 128 may include an electrically conductive material such as titanium nitride, although other materials, such as tantalum nitride, titanium, tantalum, or the like, may alternatively be utilized. The barrier layer 128 may be formed using a CVD process, such as PECVD. Work function layers may be included in the gate structures 103-1, 103-2. For example, P-type work function layer(s) may be formed in the first region 104A, and N-type work function layer(s) may be formed in the second region 104B. The P-type work function layer may include TiN, TaN, Ru, Mo, Al, WN, $ZrSi_2$, $MoSi_2$, $TaSi_2$, $NiSi_2$, WN, other suitable P-type work function materials, or a combination thereof. The N-type work function layer may include Ti, Ag, TaAl, TaAlC, TiAlN, TaC, TaCN, TaSiN, Mn, Zr, other suitable N-type work function materials, or a combination thereof.

The seed layer 130 is formed over the barrier layer 128 (or the work function layers, if present). The seed layer 130 may include copper (Cu), titanium (Ti), tantalum (Ta), titanium nitride (TiN), tantalum nitride (TaN), the like, or a combination thereof, and may be deposited by ALD, sputtering, physical vapor deposition (PVD), or the like. The gate electrode 132 may include a metal-containing material such as TiN, TaN, TaC, Co, Ru, Al, combinations thereof, or multi-layers thereof, and may be formed by, e.g., electroplating, electroless plating, or other suitable method.

A dielectric capping layer 133 may be formed over the gate structures 103-1, 103-2 to serve as a contact etch protection layer. The dielectric capping layer 133 may include a high-k (e.g. k>7.0) dielectric material, such as a metal oxide, a metal nitride, or other suitable dielectric materials. For example, the metal oxide may be titanium oxide ($TiO_2$), aluminum oxide ($Al_2O_3$), or other metal oxides. For example, the metal nitride may be titanium nitride (TiN), aluminum nitride (AlN), aluminum oxynitride (AlON), tantalum nitride (TaN), or other metal nitrides. The dielectric capping layer 133 may be formed over the gate structures 103-1, 103-2 by one or more deposition and etching processes. In some embodiments, such as in the examples of FIGS. 5A, 5B, 6A, and 6B, a second ESL 134 may be formed over the dielectric layer 124. The second ESL 134 may include similar materials as the ESL 122 and may be formed using similar processes as described above in reference to the ESL 122.

In order to implement a circuit (e.g. providing a Boolean logic function or a storage function), interconnect structures may be formed over the multiple-fin FinFET devices 101A, 101B of the first standard cell SC1 so as to provide intra-cell connections for the multiple-fin FinFET devices 101A, 101B as well as connections to bias voltage lines. Similarly, interconnect structures may be formed over the second gate structure 103-2 and the single-fin FinFET devices 301A, 301B of the second standard cell SC2 so as to provide intra-cell connections for single-fin FinFET devices 301A, 301B as well as connections to the bias voltage lines.

FIGS. 5A, 5B, 6A, and 6B illustrate a second dielectric layer 136 (e.g. an inter-metal dielectric (IMD) layer) that is formed over the first dielectric layer 124 (and the second ESL 134, if present), the first gate structure 103-1, and the second gate structure 103-2. The second dielectric layer 136 may include similar materials as the first dielectric layer 124 and may be formed by a deposition process that is similar to or the same as the deposition process for forming the first dielectric layer 124. Silicide regions 138A, 138B, 338A, 338B are formed over the source/drain features 114A, 114B, 314A, 314B, respectively, by an etching process, a deposition process, a thermal anneal process, or a combination thereof. The etching process is performed to form openings (not shown) that expose portions of the source/drain features 114A, 114B, 314A, 314B. The deposition process is performed to form a metal capable of reacting with semiconductor materials (e.g. silicon, germanium) to form silicide or germanide regions in the openings. The thermal anneal process is performed so that the deposited metal reacts with the source/drain features source/drain features 114A, 114B, 314A, 314B to form the silicide regions 138A, 138B, 338A, 338B, respectively. After the thermal anneal process, the unreacted metal is removed.

FIGS. 5A, 5B, 6A, and 6B illustrate contacts 140A, 140B, 340A, 340B that are formed by filling the openings that are used to form the silicide regions 138A, 138B, 338A, 338B, respectively. The contacts 140A, 140B, 340A, 340B may be formed by a self-aligned contact process including a deposition processes and a subsequent a planarization process such as chemical-mechanical polishing (CMP). In some embodiments, one or more of the contacts 140A, 140B, 340A, 340B includes a barrier layer 142, a seed layer 144, and a conductive material 146. The barrier layer 142 may include an electrically conductive material such as titanium (Ti), titanium nitride (TiN), tantalum (Ta), tantalum nitride (TaN), or the like, and may be formed using a CVD process, such as plasma-enhanced CVD (PECVD). The seed layer 144 may be deposited by PVD, ALD or CVD, and may be formed of tungsten, copper, or copper alloys. The conductive material 146 may include tungsten, although other suitable materials such as aluminum, copper, tungsten nitride, platinum, ruthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g. electroplating) may be used to form the conductive material 146. In some embodiments, such as in the examples of FIGS. 5A, 5B, 6A, and 6B, a third ESL 148 may be formed over the dielectric layer 136 and the contacts 140A, 140B, 340A, 340B. The third ESL 148 may include similar materials as the ESL 122 and may be formed using similar processes as described above in reference to the ESL 122.

Figure 7:
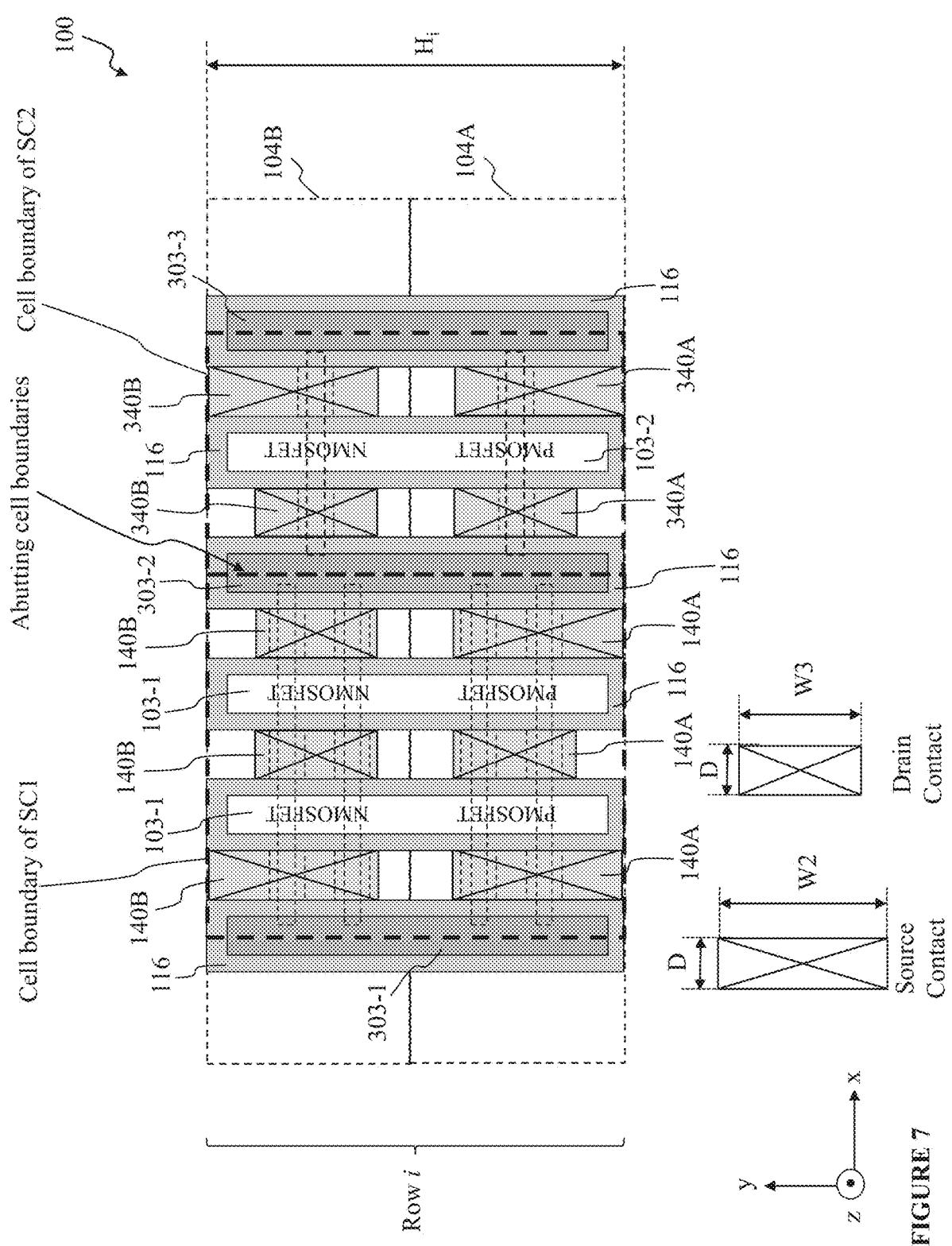
FIGS. 7 and 9 to 10 show simplified top-down schematic views of interconnect structures disposed in the first standard cell and the second standard cell, in accordance with one or more embodiments.

A top-down view of the contacts 140A, 140B, 340A, 340B is shown in FIG. 7. It is noted that FIG. 7 is the same as FIG. 2A with the addition of the contacts 140A, 140B, 340A, 340B over fin structures 106A, 106B, 306A, 306B, respectively. Some reference numerals depicted in FIG. 2A are omitted from FIG. 7 for the sake of simplicity and to highlight structural and positional features of the contacts 140A, 140B, 340A, 340B (which may be slot contacts). As seen in FIG. 7, the contacts 140A, 140B, 340A, 340B include source contacts (having a dimension D measured in the first direction and a dimension W2 measured in the second direction) and drain contacts (having the dimension D measured in the first direction and a dimension W3 measured in the second direction). The dimension D may be in the range of about 5 nanometers to about 30 nanometers. The dimension W2 may be about 1.5 times to about 10 times larger than the dimension W3, and the dimension W3 may be in the range of about 10 nanometers to about 60 nanometers. A ratio of the dimension W2 to the dimension D may be greater than about 2. Similarly, a ratio of the dimension W3 to the dimension D may be greater than about 2. As illustrated in FIG. 7, each of the contacts 140A, 140B is contained within the cell boundary of the first standard cell SC1. Furthermore, an edge of each of the source contacts among the contacts 140A, 140B coincides with the cell boundary of the first standard cell SC1. On the other hand, an edge of each of the drain contacts among the contacts 140A, 140B is spaced apart from the cell boundary of the first standard cell SC1. A similar observation is seen for each of the contacts 340A, 340B contained within the cell boundary of the second standard cell SC2.

FIG. 7 additionally shows that because of the spatial relationship between the multiple-fin FinFET devices 101A 101B of the first standard cell SC1 and the single-fin FinFET devices 301A, 301B of the second standard cell SC2, the single-fin structures 306A, 306B of the single-fin FinFET devices 301A, 301B are disposed below or aligned with a center region of the drain contacts 340A, 340B, respectively. This spatial relationship between the multiple-fin FinFET devices 101A 101B of the first standard cell SC1 and the single-fin FinFET devices 301A, 301B of the second standard cell SC2 alleviates constraints on the source/drain landing margin for the single-fin FinFET devices 301A, 301B and aligns the fin structures 306A, 306B to a center region of contacts (e.g. slot contacts) that land on and contact the drain features of the single-fin FinFET devices 301A, 301B, which, in turn, decreases contact resistance and contact capacitance.

Figure 8:
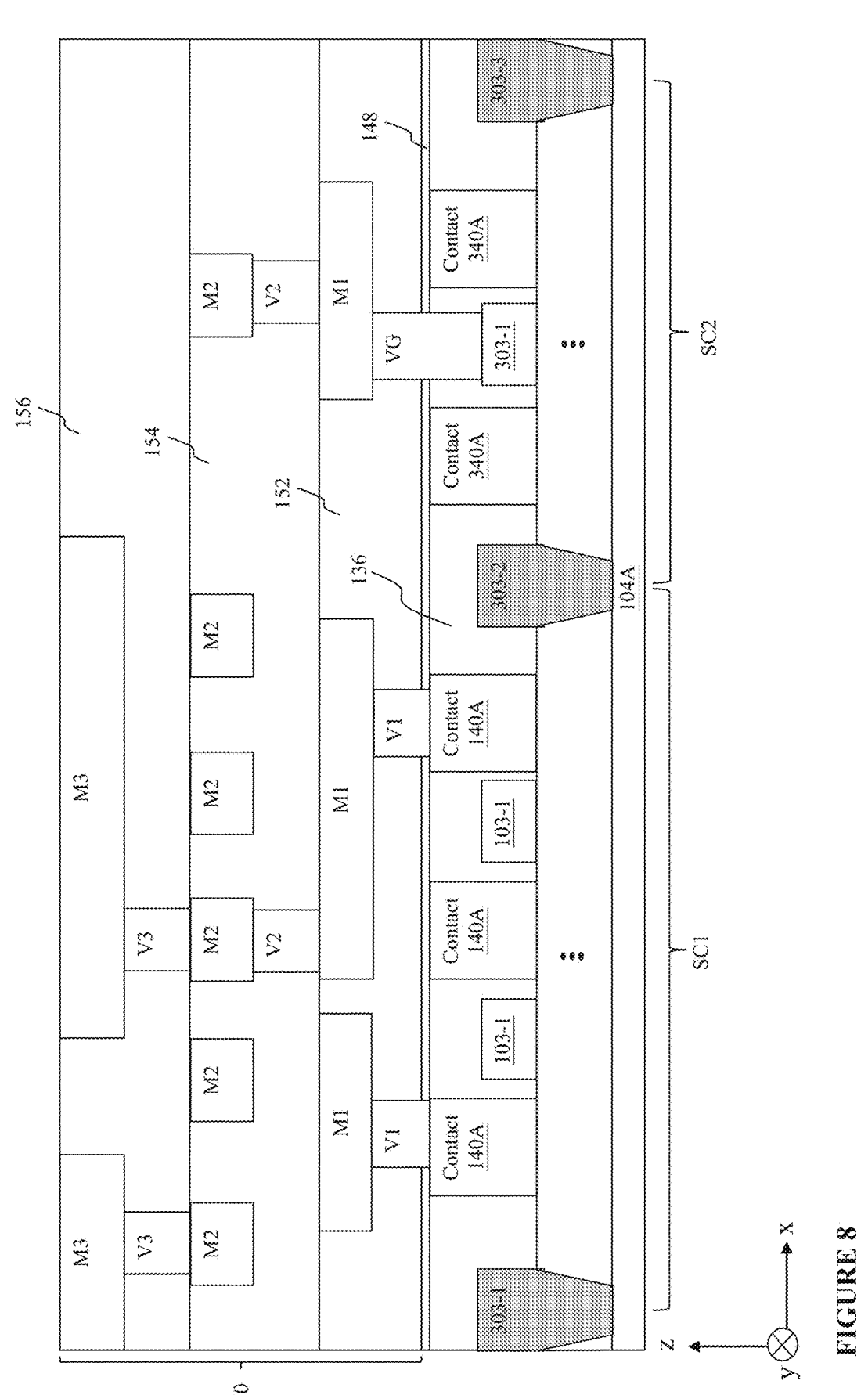
FIG. 8 illustrates a metallization layer, in accordance with an embodiment.

Metallization layers (collectively labeled as layers 150 in FIGS. 5A, 5B, 6A, and 6B) are formed over the dielectric layer 136, the contacts 140A, 140B, 340A, 340B, the gate structures 103-1, 103-2, and the third ESL 148 (if present). FIG. 8 illustrates the metallization layers 150 in greater detail, in accordance with an embodiment. In the example of FIG. 8, the metallization layers 150 include a first metallization layer (including first conductors M1 and first vias V1), a second metallization layer (including second conductors M2 and second vias V2), and a third metallization layer (including third conductors M3 and third vias V3). The metallization layers 150 may include additional metallization layers over the third metallization layer. As seen in FIG. 8, in order to isolate the first and second standard cells SC1, SC2 from each other and from other standard cells of the Row i, the isolation structures 303-1, 303-2, 303-3 (e.g. implemented using dielectric gates) extend into the semiconductor material and contact the underlying well region at the boundaries of the first and second standard cells SC1, SC2.

The first conductors M1 and first vias V1 of the first metallization layer are disposed in a dielectric layer 152. The dielectric layer 152 may include one layer of dielectric material(s) or multiple layers of dielectric materials. The dielectric layer 152 may include a low-k dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 152 may be deposited by a PECVD process, or other suitable deposition technique. The first vias V1 are disposed directly over and in contact (e.g. physical contact) with one or more of the contacts 140A, 140B, 340A, 340B, depending on the circuit implemented in the first standard cell SC1 and the second standard cell SC2. The first vias V1 may be referred to as contact vias. In the example of FIG. 8, gate vias VG are also disposed in the dielectric layer 152 and extend into the underlying dielectric layer 136 to contact (e.g. physically contact) one or more of the gate structures 103-1, 103-2, 303-1, 303-2, depending on the circuit implemented in the first standard cell SC1 and the second standard cell SC2. The first conductors M1 are in contact (e.g. direct contact) with the first vias V1 to provide electrical connections to some of the source, drain, and gate terminals of the FinFET devices, depending on the circuit implemented in the first standard cell SC1 and the second standard cell SC2.

In some embodiments, the first conductors M1 and the first vias V1 are each formed by a separate single damascene process. In other embodiments, the first conductors M1 and the first vias V1 are collectively formed by a dual damascene process. The first vias V1 may be formed by etching via holes into the dielectric layer 152 and ESL 148 (if present) and depositing one or more conductive materials into the via holes. In an embodiment, the first vias V1 include one or more barrier layers on sidewalls of the via holes and in direct contact with the dielectric layer 152. The first vias V1 may further include a metal fill layer surrounded by the barrier layer(s). The barrier layer may include a conductive material such as Ti, TiN, or TaN, and the metal fill layer may include W, Co, Ru, Cu, Pt, Ni, Al, other suitable materials, or a combination thereof. In a particular embodiment, the first vias V1 include only the metal fill layer and is free of any barrier layer between the metal fill layer and the surrounding dielectric materials. To further this embodiment, the first vias V1 may include tungsten (W) in direct contact with the dielectric layer 152 that surround the first vias V1. One benefit of having such via structure (e.g. having W without any barrier layer) is that the first vias V1 can be made very small in order to increase the device integration density. The gate vias VG may be formed by etching via holes in the dielectric layer 152, the ESL 148 (if present), and the dielectric layer 136 and depositing one or more conductive materials into the via holes. The conductive materials of the gate vias VG may be similar to the materials described above in reference to the first vias V1. In an embodiment, the first conductors M1 may include a barrier layer surrounding a metal fill layer, where the barrier layer includes Ti, TiN, TaN, or other suitable materials, and the metal fill layer includes W, Co, Ru, Cu, Pt, Ni, Al, or other suitable materials, or a combination thereof.

The second conductors M2 and second vias V2 of the second metallization layer are disposed in a dielectric layer 154. The dielectric layer 154 may include one layer of dielectric material(s) or multiple layers of dielectric materials. The dielectric layer 154 may include materials similar to the materials of the dielectric layer 152. The second vias V2 and the second conductors M2 may include materials similar to the materials of the first vias V1 and the first conductors M1, respectively. The second vias V2 contact (e.g. directly contact) respective first conductors M1 of the first metallization layer.

In a similar manner, the third conductors M3 and third vias V3 of the third metallization layer are disposed in a dielectric layer 156. The dielectric layer 156 may include one layer of dielectric material(s) or multiple layers of dielectric materials. The dielectric layer 156 may include materials similar to the materials of dielectric layer 152. The third vias V3 and the third conductors M3 may include materials similar to those in the first vias V1 and the first conductors M1, respectively. The third vias V3 contact (e.g. directly contact) respective second conductors M2 of the second metallization layer.

In the embodiment shown in FIG. 8, the conductors M1 and M3 are oriented in the longitudinal direction of the fin structures (e.g. generally along the x-direction), while the conductors M2 are oriented in the longitudinal direction of the gate structures (e.g. generally along the y-direction). Stated differently, the conductors M1 and M3 are generally parallel to the lengthwise direction of the fin structures 106A, 106B, 306A, 306B, while the conductors M2 are generally parallel to the lengthwise direction of the gate structures 103-1, 103-2.

Figure 9:
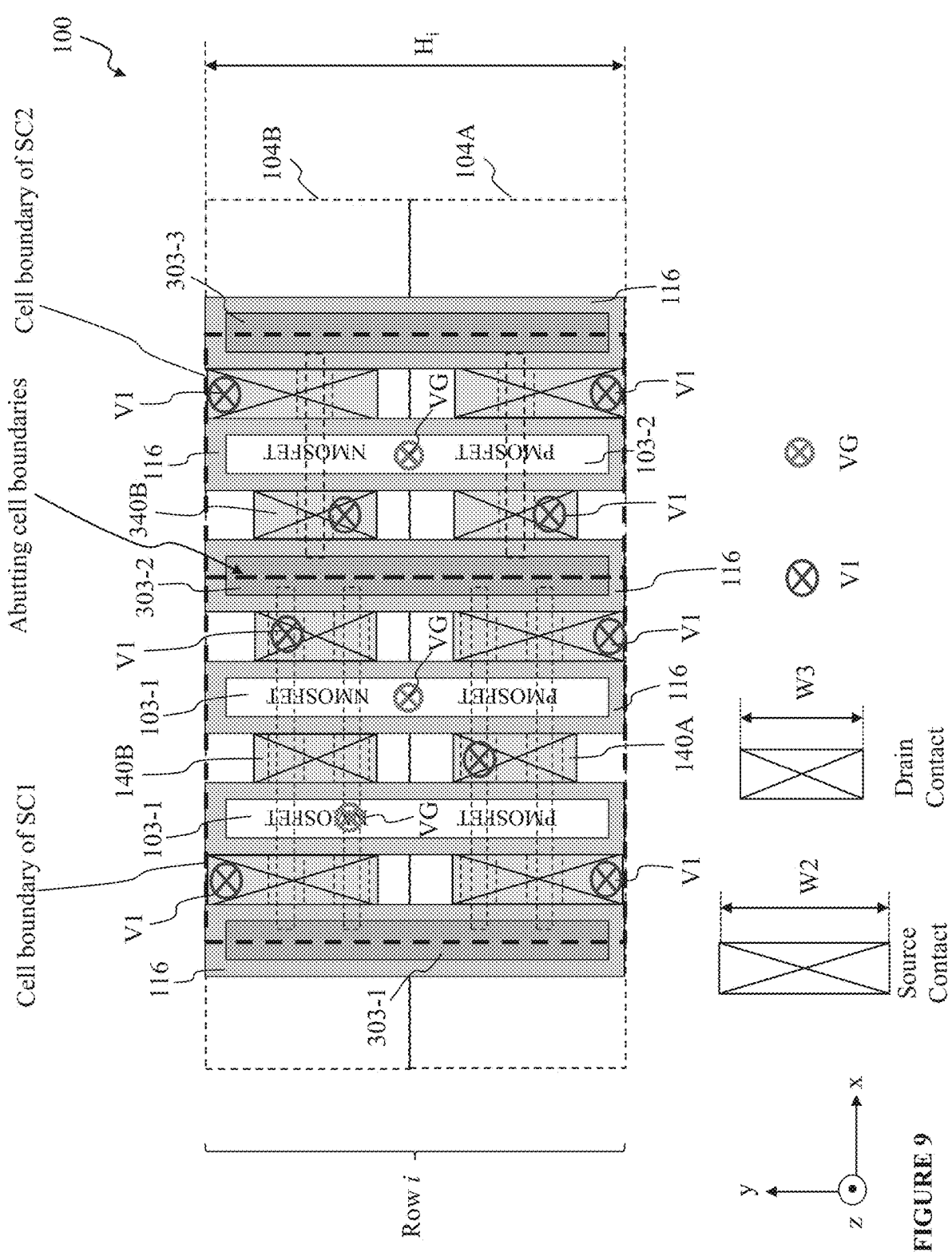
Figure 10:
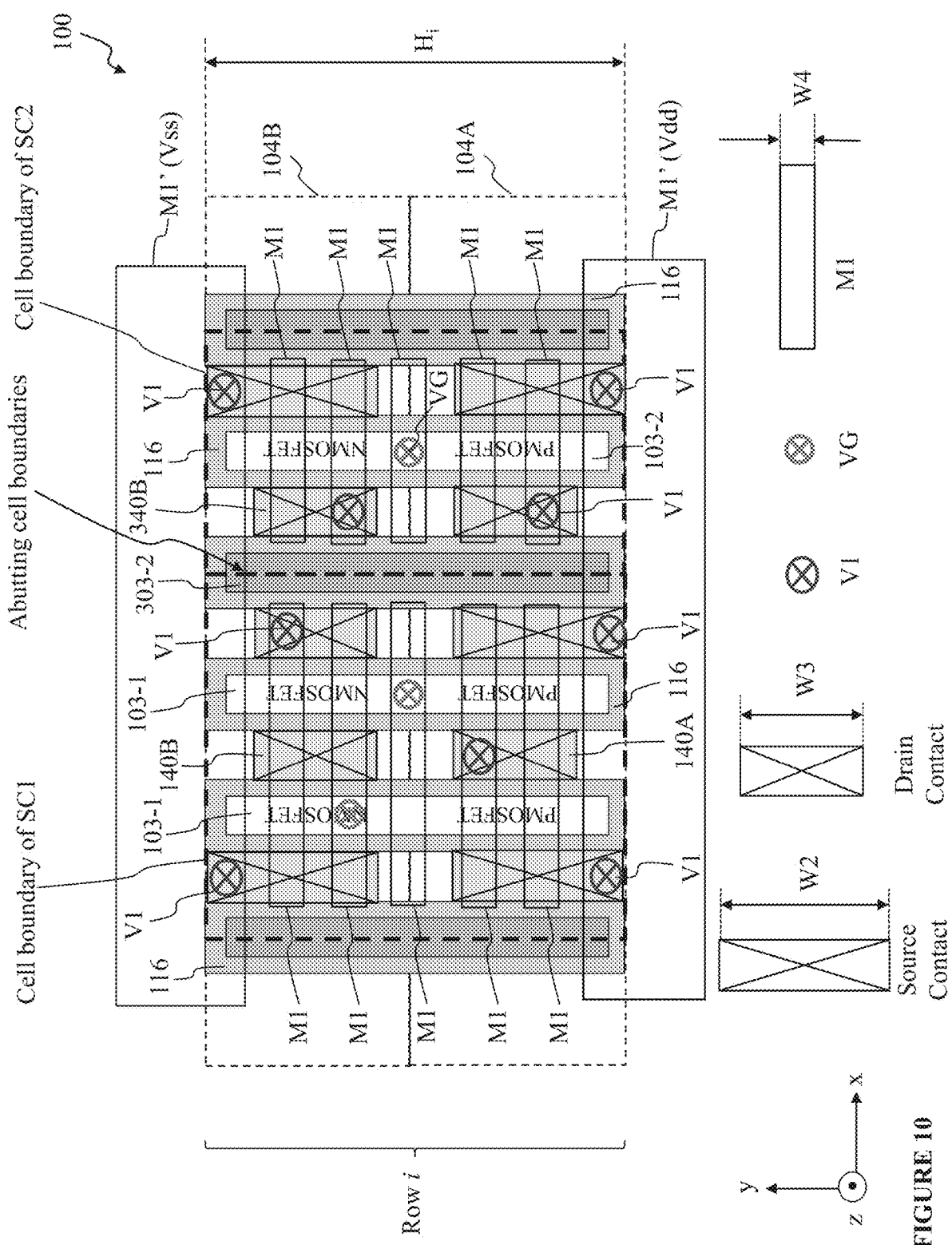

FIG. 9 shows a top-down view of the first vias V1 and the gate vias VG formed over the contacts 140A, 140B, 340A, 340B in the first and second standard cell SC1, SC2, according to an embodiment. It is noted that FIG. 9 is the same as FIG. 7 with the addition of the first vias V1 and the gate vias VG. FIG. 10 shows a top-down view of the first conductors M1 formed over the first vias V1 and the gate vias VG in the first and second standard cell SC1, SC2, according to an embodiment. It is noted that FIG. 10 is the same as FIG. 9 with the addition of the first conductors M1. The underlying fin structures 106A, 106B, 306A, 306B of FIG. 9 are omitted in FIG. 10 so that so that spatial characteristics of the first conductors M1 may be highlighted. Some first conductors M1' extend out of the cell boundaries of the first and second standard cells SC1, SC2, in a top-down view, and may be coupled to respective bias voltage lines (e.g. Vdd and Vss). First conductors M1 that are contained within the cell boundaries of the first and second standard cells SC1, SC2 in a top-down view may be used for intra-cell connections for the first standard cell SC1 and the second standard cell SC2, with such first conductors M1 having a dimension W4 measured in the second direction. The dimension W4 may be between about 5 nanometers and about 20 nanometers.

Figure 11:
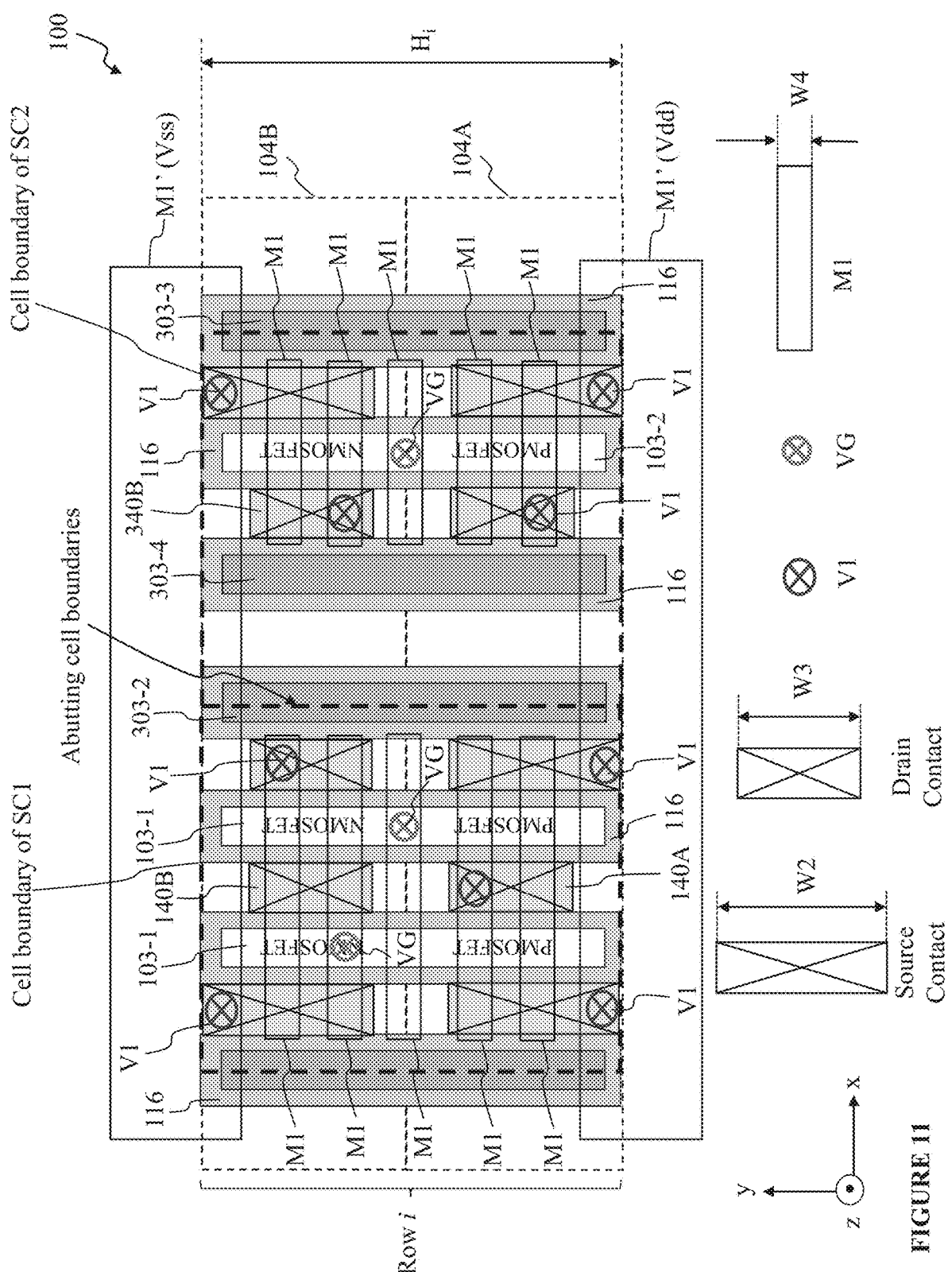
FIG. 11 shows a simplified top-down schematic view of the first standard cell and the second standard cell of the array of standard cells of FIG. 1, in accordance with another embodiment.

In the standard cells SC1, SC2 depicted in FIG. 10, the adjacent standard cells SC1, SC2 are isolated by a single isolation structure 303-2. However, as shown in FIG. 11, some embodiments may use a plurality of isolation structures to isolate adjacent standard cells. For example, the example of FIG. 11 shows an embodiment where the second standard cell SC2 includes a further isolation structure 303-4 disposed within the cell boundary of the second standard cell SC2 such that the multiple-fin FinFET devices 101A, 101B of the first standard cell SC2 and the single-fin FinFET devices 301A, 301B of the second standard cell SC2 are separated by the plurality of isolation structures 303-2, 303-4. It is further noted that the isolation structures for electrically isolating adjacent standard cells from each other may be an isolation MOSFET in other embodiments.

Referring back to FIG. 1, the array of standard cells also includes a Row i+1 that is adjacent to the Row i. In contrast to the Row i, the Row i+1 does not include standard cells having one or more multiple-fin FinFET devices. Rather, each of the standard cells in the Row i+1 only includes single-fin FinFET devices. The Row i may be an odd row of the array of standard cells, and the Row i+1 may be an even row of the array of standard cells. Standard cells of the Row i+1 may have a dimension $H_{i+1}$ (e.g. a cell height), measured in the second direction, that is indicative of (e.g. equal to) a distance between opposing boundaries of the cells of the Row i+1. A ratio of the dimension $H_i$ to the dimension $H_{i+1}$ may be between about 1.1 and about 2 (e.g. in a range of about 1.25 to about 1.5). It is noted that this range of ratios may have the effect of balancing efficient use of real estate and maintaining functionality. For example, if the range of ratios falls below 1.1, this may adversely affect circuit functionality since the multiple-fin FinFET devices of Row i may have a minimum area needed to function; conversely, if the range of ratios exceeds about 2, this may adversely affect the efficient use of chip real estate.

In some embodiments, the Row i and/or Row i+1 may additionally include one or more filler cells. In the example of FIG. 1, the Row i+1 includes a filler cell. Some of the filler cells may be dummy cells lacking functionality or circuitry. Alternatively or additionally, some of the filler cells may be well tap cells for biasing the first region 104A and/or second region 104B. In embodiments where some of the filler cells are well tap cells, the filler cells may include well strap structure (e.g. implemented using a plurality of fin structures).

Figure 12:
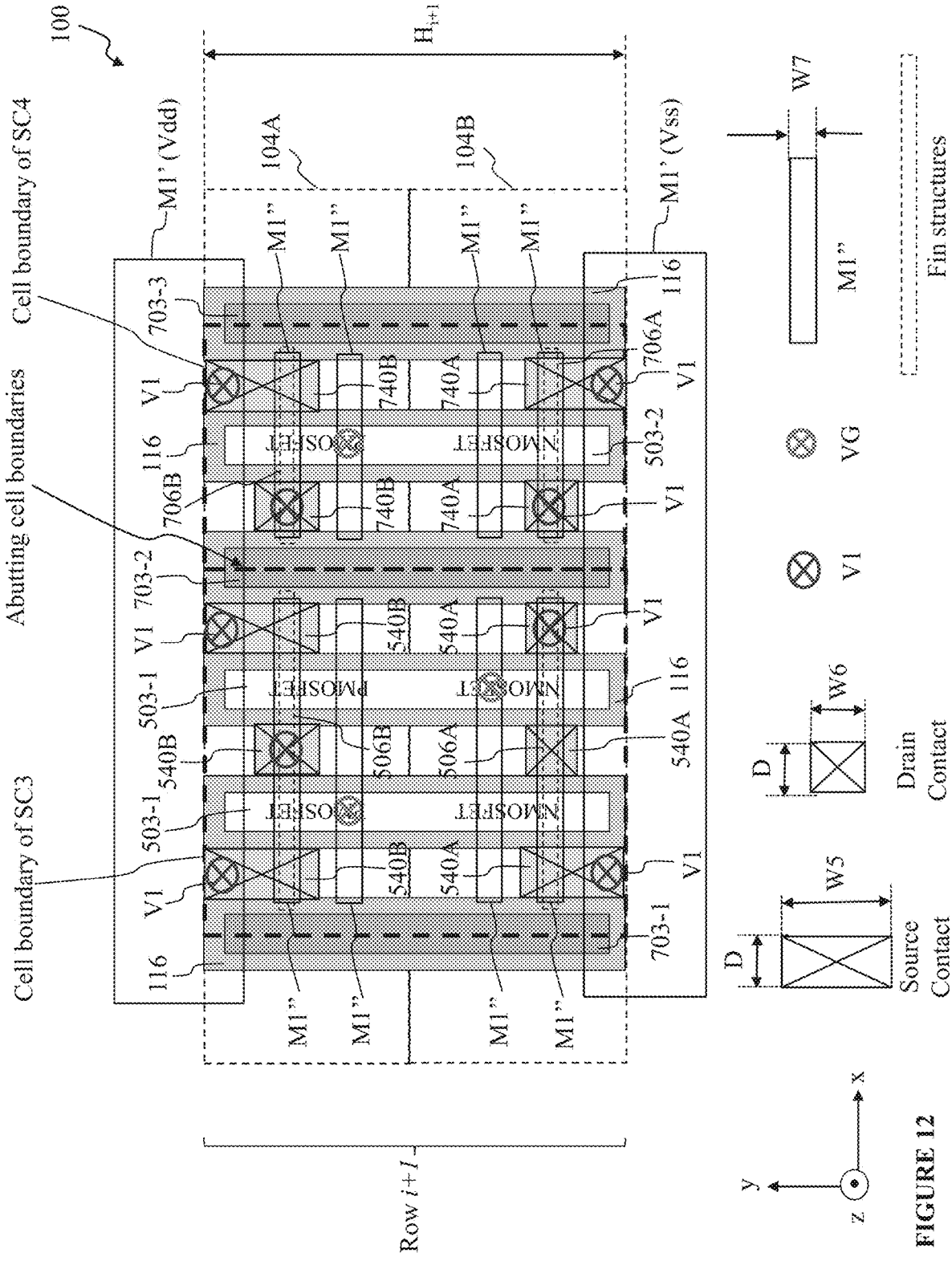
FIG. 12 shows a simplified top-down schematic view of a third standard cell and a fourth standard cell of the array of standard cells of FIG. 1, in accordance with an embodiment.

FIG. 12 shows a simplified top-down schematic view of a third standard cell SC3 and a fourth standard cell SC4 of the Row i+1, in accordance with an embodiment. FIG. 12 illustrates the cell boundaries of the third and fourth standard cells SC3, SC4. FIG. 12 also illustrates isolation structures 703-1, 703-2, 703-3 that are disposed on the boundaries of the third and fourth standard cells SC3, SC4 to isolate the third and fourth standard cells SC3, SC4 from each other and from other standard cells of the Row i+1. The isolation structures 703-1, 703-2, 703-3 may include similar materials as those described above in reference to isolation structures 303-1, 303-2, 303-3. Each of the third and fourth standard cells SC3, SC4 includes an N-type single-fin FinFET device and a P-type single-fin FinFET device, which may be similar to the single-fin FinFET devices 301A, 301B described above.

Third gate structures 503-1 engage the single fins 506A, 506B of the N-type single-fin FinFET device and the P-type single-fin FinFET of the third standard cell SC3, as illustrated in FIG. 12. Similarly, a fourth gate structure 503-2 engages the single fins 706A, 706B of the N-type single-fin FinFET device and the P-type single-fin FinFET of the fourth standard cell SC4. As seen in FIG. 12, a projection of a longitudinal axis of the single fin 706A of the N-type single-fin FinFET device of the fourth standard cell SC4 along the first direction coincides with a longitudinal axis of the single fin 506A of the N-type single-fin FinFET device of the third standard cell SC3. In like manner, a projection of a longitudinal axis of the single fin 706B of the P-type single-fin FinFET device of the fourth standard cell SC4 along the first direction coincides with a longitudinal axis of the single fin 506B of the P-type single-fin FinFET device of the third standard cell SC3.

Interconnect structures may be formed over the third and fourth gate structures 503-1, 503-2 and the single-fin FinFET devices of the third and fourth standard cells SC3, SC4 so as to provide intra-cell connections for single-fin FinFET devices as well as connections to the bias voltage lines. Such interconnect structures include contacts 540A that contact source/drain features of the single-fin N-type FinFET device of the third standard cell SC3 and contacts 540B that contact source/drain features of the single-fin P-type FinFET device of the third standard cell SC3. The contacts 540A, 540B may be connected to first vias V1 of the metallization layers 150. The gate via VG may contact the third gate structure 503-1 of the third standard cell SC3. Similarly, referring to the fourth standard cell SC4, contacts 740A contact source/drain features of the single-fin N-type FinFET device of the fourth standard cell SC4, and contacts 740B contact source/drain features of the single-fin P-type FinFET device of the fourth standard cell SC4. The contacts 740A, 740B may be connected to first vias V1 of the metallization layers 150. The gate via VG may contact the fourth gate structure 503-2 of the fourth standard cell SC3. As seen in FIG. 7, the contacts 540A, 540B, 740A, 740B include source contacts (having the dimension D measured in the first direction and a dimension W5 measured in the second direction) and drain contacts (having the dimension D measured in the first direction and a dimension W6 measured in the second direction). The dimension W5 may be about 1.5 times to about 10 times larger than the dimension W6, and the dimension W6 may be in the range of about 10 nanometers to about 40 nanometers.

First conductors M1" that are contained within the cell boundaries of the third and fourth standard cells SC3, SC4 in a top-down view may be used for intra-cell connections for the third standard cell SC3 and the fourth standard cell SC4, with such first conductors M1" having a dimension W7 measured in the second direction. A ratio of the dimension W4 of the first conductors M1 of the Row i to the dimension W7 of the first conductors M1" of the Row i+1 may be between about 1.05 and about 2 (e.g. between 1.2 and about 2 or between 1.1 and 1.4). This range of values for the ratio may be an effect of Row i+1 having a smaller dimension (e.g. in the y-direction) than Row i. For example, in order to have enough routing lines within the third standard cell SC3 and the fourth standard cell SC4 to meet cell internal routing requirements, the metal lines of these cells may need to be narrower than the metal lines of the first and second standard cells SC1, SC2. Furthermore, as seen in a comparison of FIGS. 12 and 2A, the number of first conductors M1 in each standard cell of the Row i may have a greater than the number of first conductors M1" in each standard cell of the Row i+1.

The fin structures 106A, 106B, 306A, 306B of the first and second standard cells SC1, SC2 may be formed over the substrate 102 by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Additionally or alternatively, directed self-assembly (DSA) techniques may be implemented while forming fin structures 106A, 106B, 306A, 306B from the substrate 102.

FIGS. 13A to 13J show top-down views of an embodiment double patterning lithography process that may be used to form the fin structures 106A, 106B, 306A, 306B of the first and second standard cells SC1, SC2 over the substrate 102. FIGS. 14A to 14J show cross-sectional views of the embodiment double patterning lithography process, with the cross-sectional views being taken along the line E-E shown in FIG. 13A.

Figures 13A, 14A:
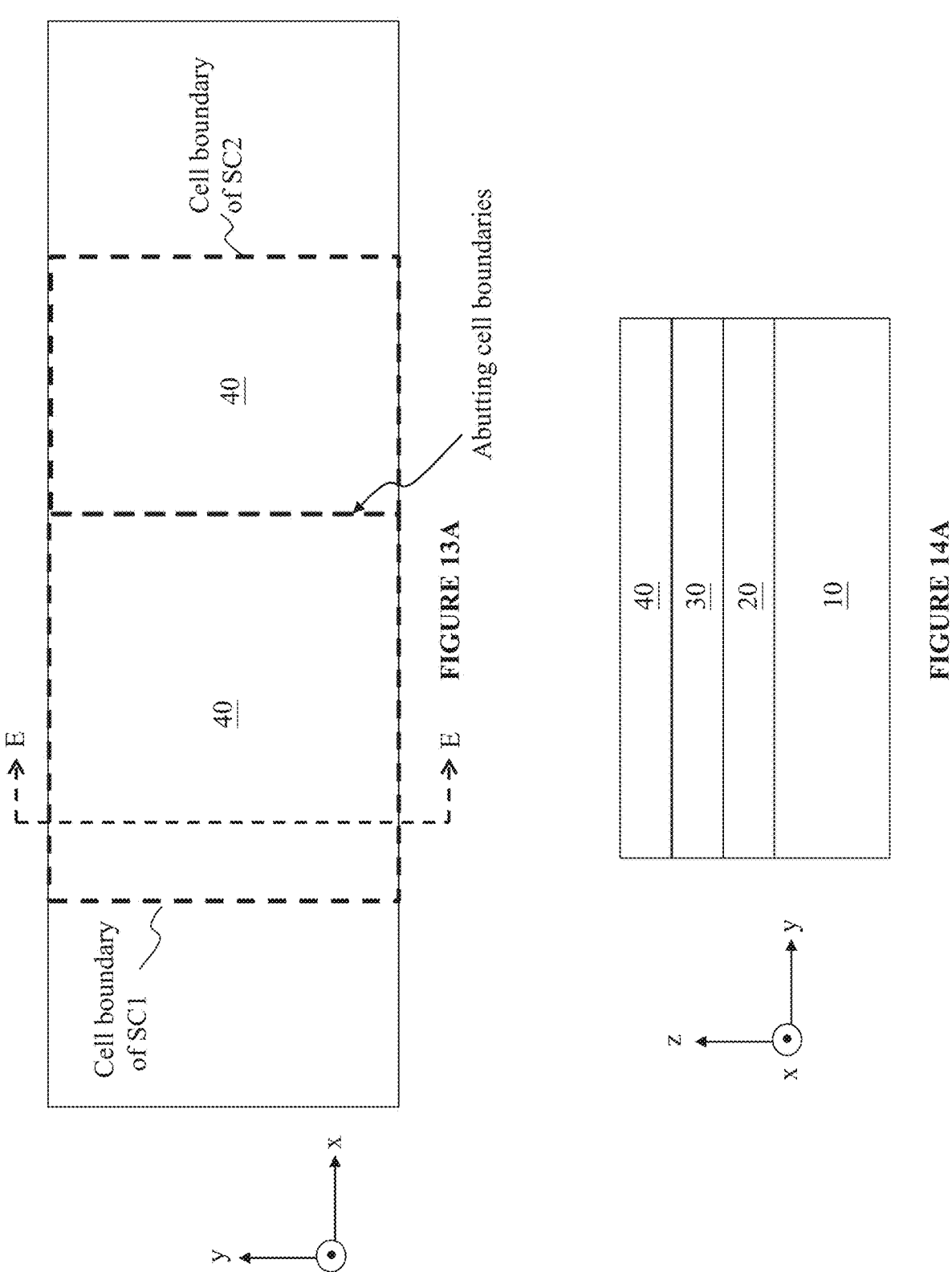
FIGS. 13A to 13J and 14A to 14J show a process flow illustrating a method for forming fin structures in the first standard cell and the second standard cell of the array of standard cells of FIG. 1, in accordance with an embodiment.

Referring to FIGS. 13A and 14A, dielectric layers 20, 30, and 40 are formed over an underlying substrate 10. The underlying substrate 10 includes materials similar to those described above in reference to substrate 102, Materials suitable for the dielectric layers 20, 30, and 40 include, but not limited to, silicon oxide, plasma enhanced silicon oxide (PEOX), silicon nitride, polysilicon, doped polysilicon, silicon oxynitride, tetraethyl orthosilicate (TEOS), nitrogen-containing oxide, nitride oxide, high-k dielectric materials, low-k dielectric materials, or combinations thereof. In an embodiment, the dielectric layer 20 is a silicon nitride layer (e.g. having a thickness of about 100 Angstroms), the dielectric layer 30 is a silicon oxide layer (e.g. having a thickness of about 1200 Angstroms), and the dielectric layer 40 is a polysilicon layer (e.g. having a thickness of about 1000 Angstroms). The dielectric layers 20, 30, and 40 may each be formed by one or more deposition techniques, such as thermal oxidation, CVD, PVD, PECVD, and ALD. The dielectric layers 20 and 30 are used for patterning the underlying substrate 10. Therefore, these layers may also be referred to as patterning layers 20 and 30, respectively. In various embodiments, other dielectric layers may be formed over the underlying substrate 10 and used for the purposes of patterning the substrate 10. The other dielectric layers may be disposed between, above, or below the dielectric layers 20 and 30. In an embodiment, one or both of the layers 20 and 30 may be omitted if the underlying substrate 10 includes a patterning layer therein.

Figures 13B, 14B:
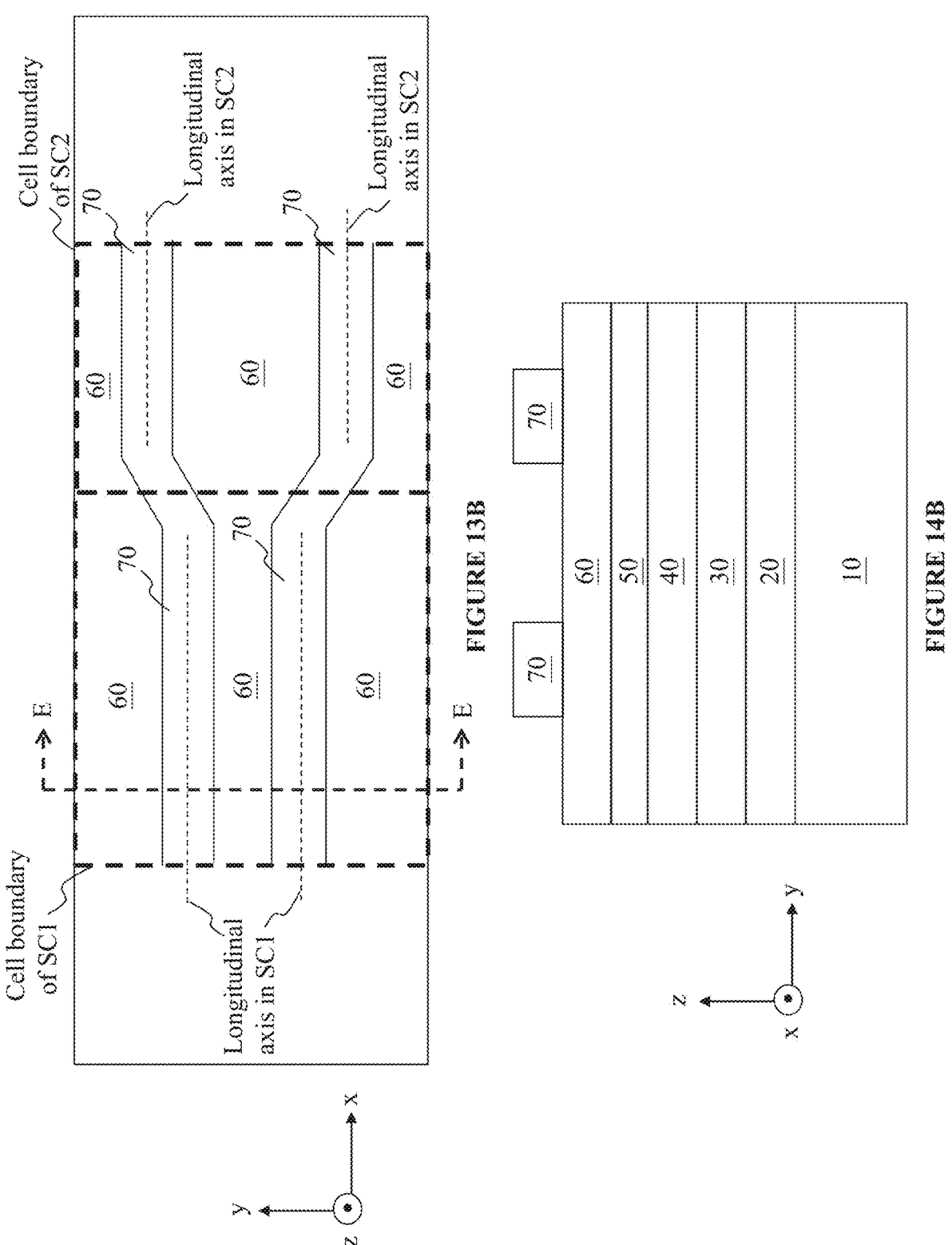

Referring to FIGS. 13B and 14B, a patterned photoresist (or resist pattern) 70 over layers 60 and 50, which are disposed over the dielectric layer 40. In an embodiment, the layer 60 is a silicon-containing hard mask layer and the layer 50 is an anti-reflective coating layer. The layers 50 and 60 may be formed using CVD, PVD, or other suitable methods. In another embodiment, the resist pattern 70 may be formed directly over the dielectric layer 40 without the layers 60 and 50. In an embodiment, the resist pattern 70 is formed using a photolithography process. For example, a resist layer is formed on the layer 60 using a spin-coating process and a soft baking process. Then, the resist layer is exposed to a radiation using a mask having the definitions for subsequent mandrel patterns (see below with regards to FIGS. 13C and 14C). The exposed resist layer is developed using post-exposure baking, developing, and hard baking, thereby forming the resist pattern 70 over the layer 60.

As seen in FIGS. 13B and 14B, the resist pattern layer 70 within the boundary of the first standard cell SC1 is offset (e.g. in the second direction) relative to the resist pattern layer 70 within the boundary of the second standard cell SC2. Stated differently, when viewed in a top-down view, the longitudinal axis of the resist pattern layer 70 in the first standard cell SC1 is shifted in the second direction with respect to the longitudinal axis of the resist pattern layer 70 in the second standard cell SC2. This offset may be needed so that the fin structures 106A, 106B, 306A, 306B that are formed in the first and second standard cells SC1, SC2 have the spatial and positional features described above in reference to FIG. 2B.

Figures 13C, 14C:
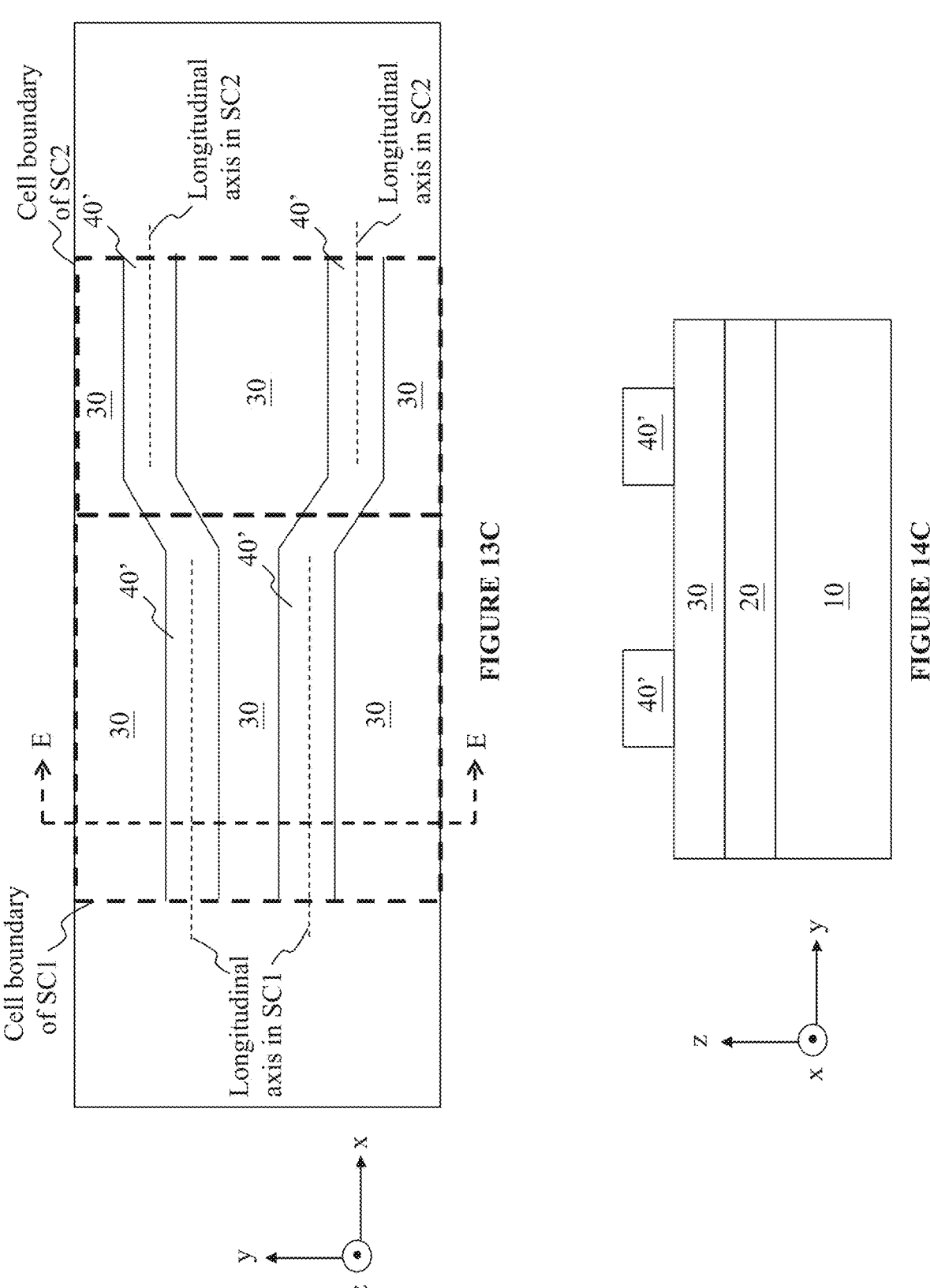

Referring to FIGS. 13C and 14C, the layers 60, 50, and 40 are subsequently etched through the openings of the resist pattern 70, forming mandrel patterns 40'. The etching process may include a dry (or plasma) etching, a wet etching, or other suitable etching methods. For example, a dry etching process may implement an oxygen-containing gas, a fluorine-containing gas (e.g. $CF_4$, $SF_6$, $CH_2F_2$, $CHF_3$, and/or $C_2F_6$), a chlorine-containing gas (e.g. $Cl_2$, $CHCl_3$, $CCl_4$, and/or $BCl_3$), a bromine-containing gas (e.g. HBr and/or $CHBr_3$), an iodine-containing gas, other suitable gases and/or plasmas, and/or combinations thereof. For example, a wet etching process may include etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The resist pattern 70 is removed thereafter using a suitable process, such as wet stripping or plasma ashing. The layers 60 and 50 are also removed using one or more of the etching processes, resulting in the mandrel patterns 40' over the dielectric layer 30, as shown in FIGS. 13C and 14C.

Figures 13D, 14D:
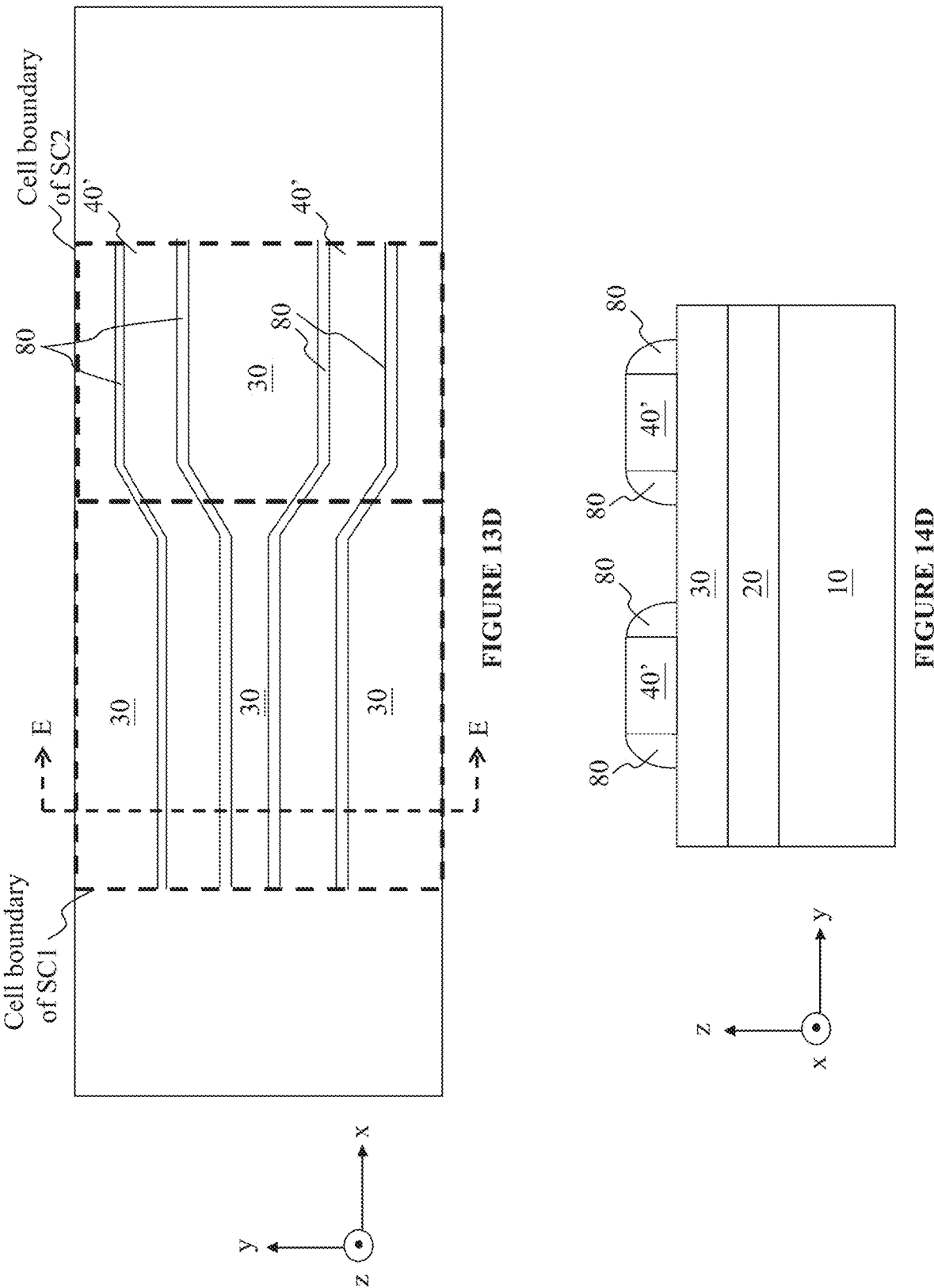

Referring to FIGS. 13D and 14D, spacer features 80 are formed on sidewalls of the mandrel patterns 40'. The spacer features 80 may include a dielectric material, such as titanium nitride, silicon nitride, or titanium oxide. The spacer features 80 may be formed by depositing a spacer layer on the mandrel patterns 40' by a CVD process, a PVD process, an ALD process, or other suitable deposition techniques. An etching process is applied to the spacer layer to expose top surfaces of the mandrel patterns 40' and the dielectric layer 30, thereby forming the spacer features 80. In an embodiment, the etching process used to form the spacer features 80 may include one or more etchants described above in reference to the formation of the mandrel patterns 40'. However, process parameters may be tuned so that the etching is selectively tuned to etch the spacer layer while leaving the mandrel patterns 40' and the dielectric layer 30 substantially unchanged or unperturbed.

Figures 13E, 14E:
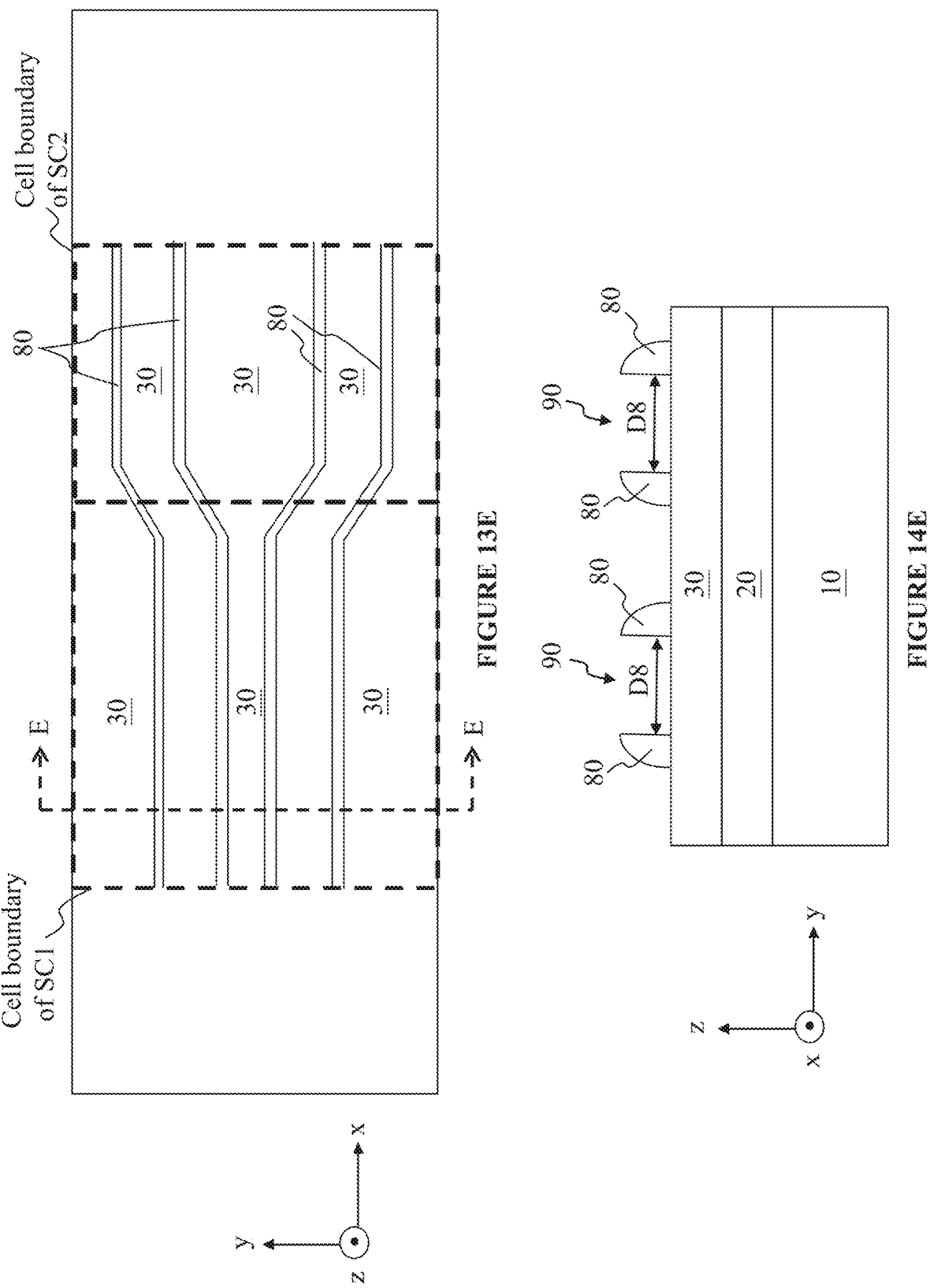
Figures 13F, 14F:
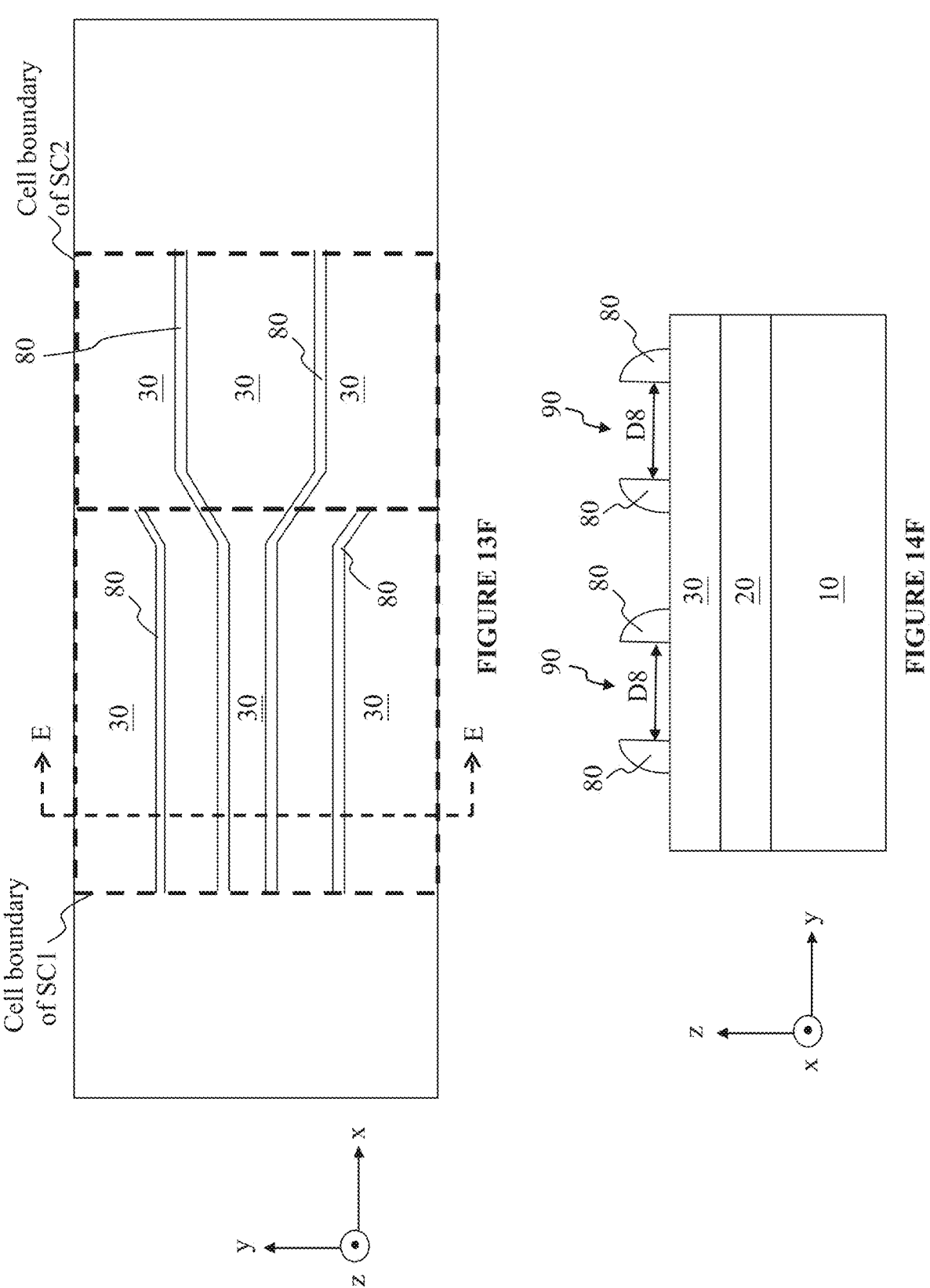

Referring to FIGS. 13E and 14E, the mandrel patterns 40' are removed by a selective etching process, resulting in trenches 90 between opposing spacer features 80. The selective etching process may be a wet etching, a dry etching, or a combination thereof. A distance D8 separating opposing spacer features 80 in the second direction (e.g. y-direction) may determine the separation distances $SD_1$, $SD_2$ described above in reference to FIG. 2B. Referring to FIGS. 13F and 14F, selected spacer features 80 located within the boundary of the second standard cell SC2 are removed by a suitable lithography and etching process (e.g. including one or more etchants described above in reference to the formation of the mandrel patterns 40'). As an example, in the embodiment of FIGS. 13E and 14E, the outermost spacer features 80 (e.g. as measured in the second direction) located within the boundary of the second standard cell SC2 are removed, while other spacer features 80 remain.

Figures 13G, 14G:
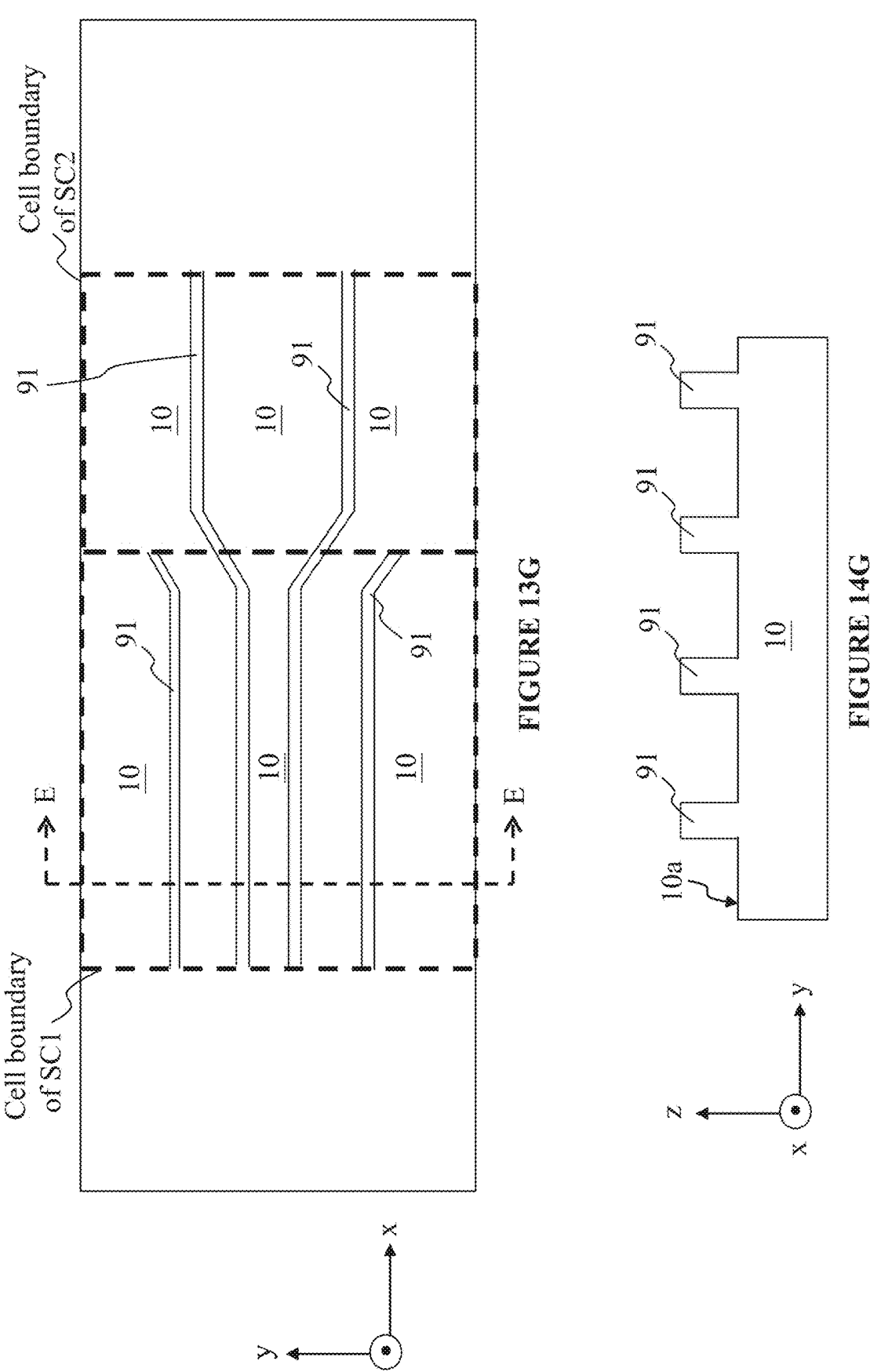

Referring to FIGS. 13G and 14G, the spacer features 80 that remain are used as a hard mask for an etch process that transfers the patterns of the spacer features 80 to the substrate 10. For example, the dielectric layers 30 and 20 are etched using the spacer features 80 as an etch mask, resulting in patterned dielectric layers. The spacer features 80 may be partially or completely consumed during the etching process. The substrate 10 is subsequently etched using at least the patterned dielectric layers as an etch mask to form fin-like features 91 (e.g. fin lines) that extend out of a major surface 10a of a remaining portion of the substrate (which forms the substrate 102 described above). The etching process can include a dry etching process (for example, a reactive ion etching (RIE) process), a wet etching process, other suitable etching process, or combinations thereof. The spacer features 80 and patterned dielectric layers 30 and 20 may be removed by a suitable stripping or planarizing process (e.g. CMP).

Figures 13H, 14H:
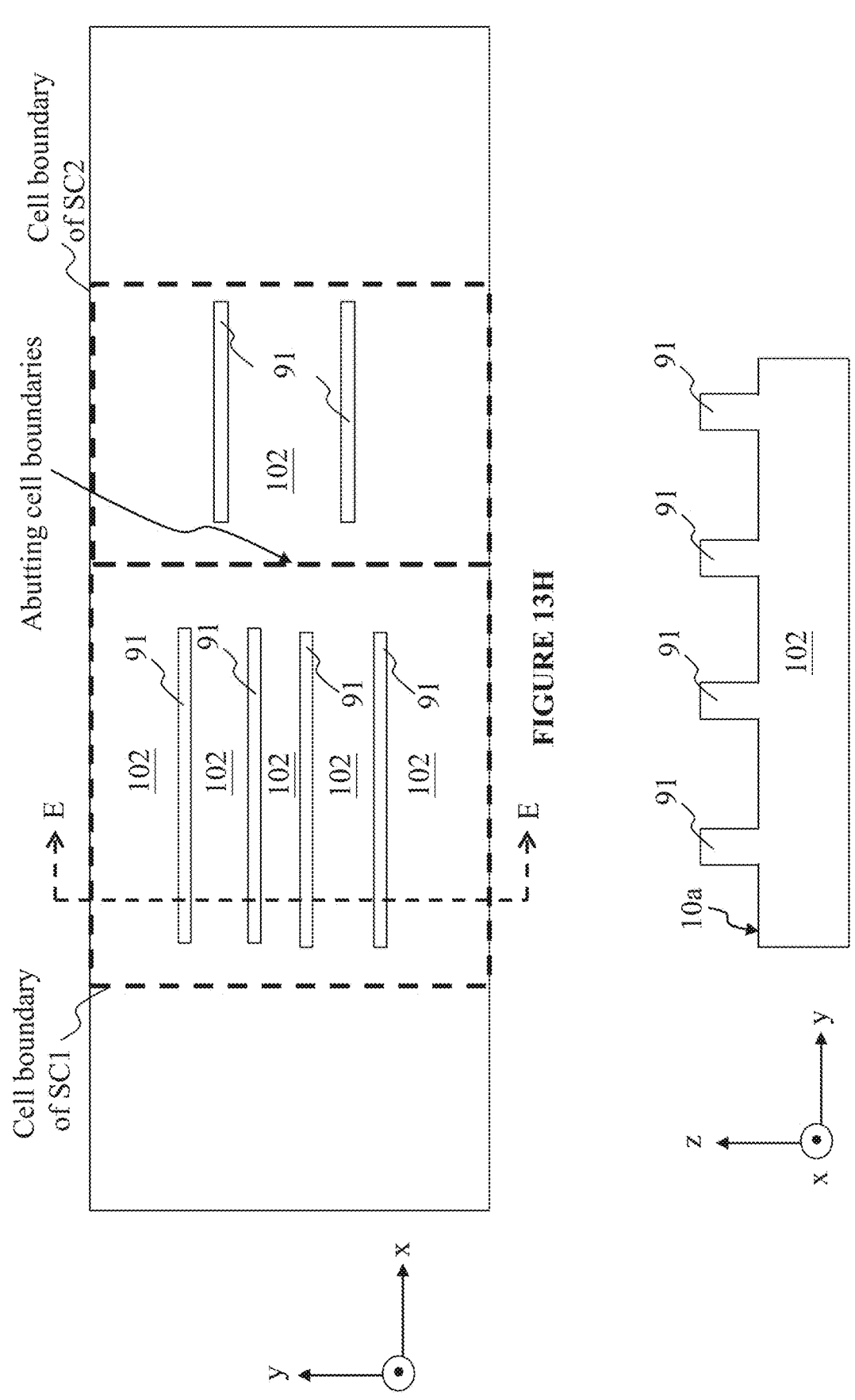

Referring to FIGS. 13H and 14H, a fin cut process may be performed to remove selective portions of the fin-like features 91 (e.g. portions that are proximate or adjacent to the boundaries of the first and second standard cells SC1, SC2). The fin cut process may be a suitable lithography and etching process (e.g. a dry etching process, a wet etching process, other suitable etching process, or combinations thereof). As a result of the fin cut process, a region is defined in which the isolation structures 303-1, 303-2, 303-3 described above may be formed. The isolation structures 303-1, 303-2, 303-2 address any induced reliability concerns that arise from the formation of fin features that straddle the abutting cell boundaries.

Figures 13I, 14I:
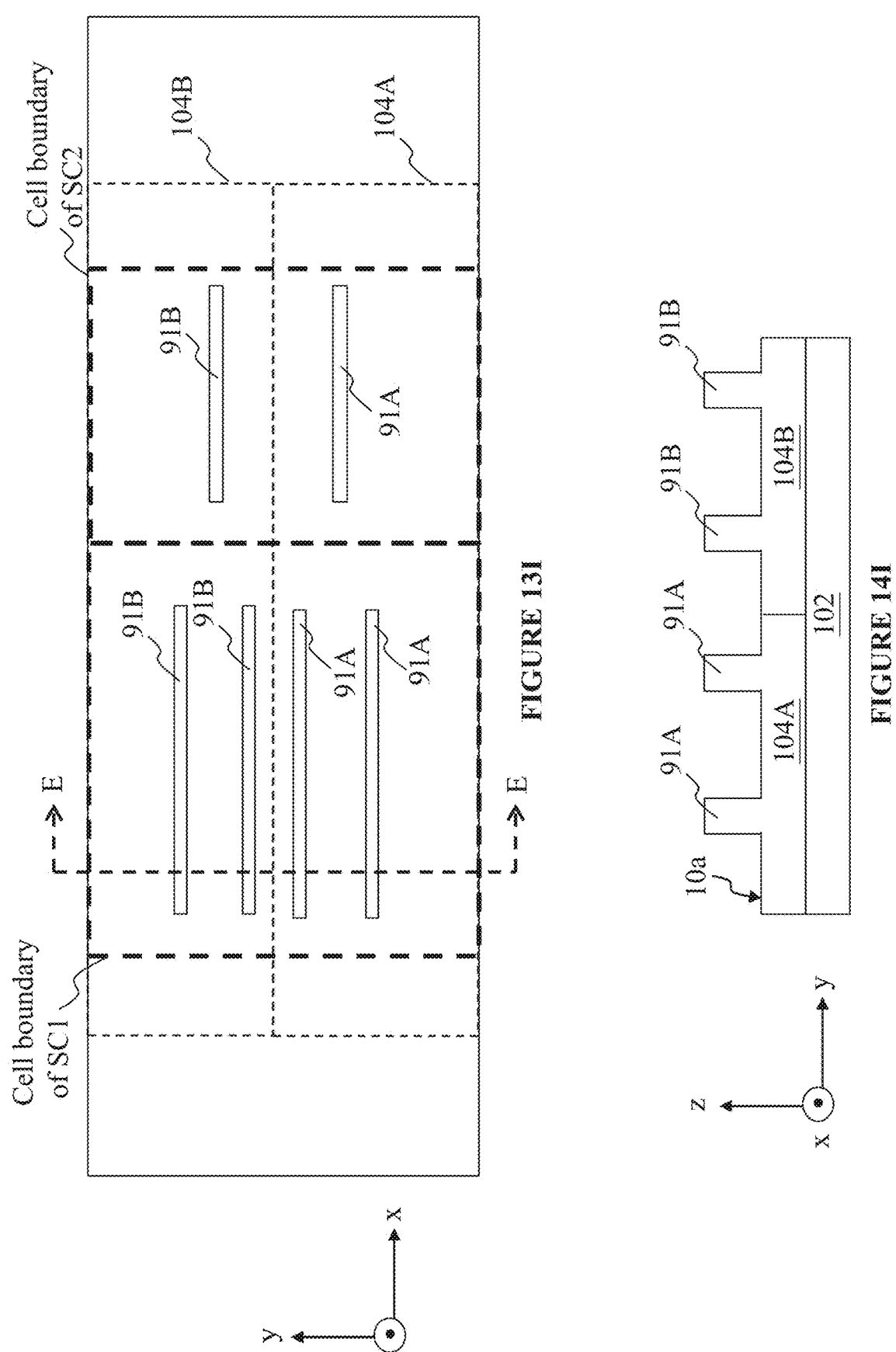
Figures 13J, 14J:
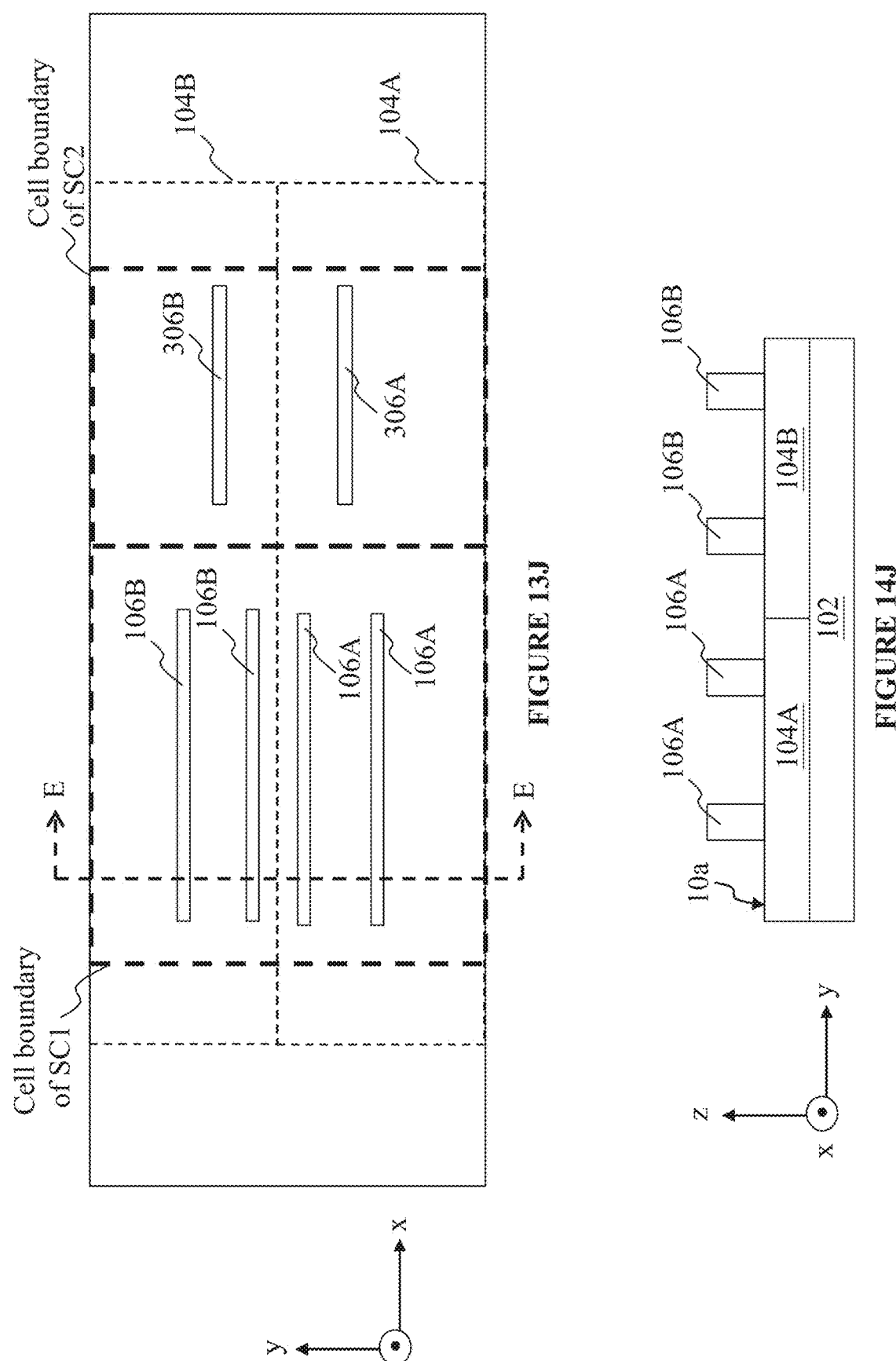

Subsequent to forming the fin-like features 91, lithography and doping processes are performed to form the first region 104A (and fin-like features 91A formed therein) and the second region 104B (and fin-like features 91B formed therein), as illustrated in FIGS. 13I and 14I. The doping processes may include ion implantation process and/or a diffusion process. Fin structures 106A and 306A are then formed by suitably doping the fin-like features 91 in the first region 104A (e.g. with P-type dopants), while fin structures 106B and 306B are formed by suitably doping the fin-like features 91 in the second region 104B (e.g. with N-type dopants). A result of the process flow shown in FIGS. 13A to 13J and 14A to 14J is the structure shown in FIG. 2B. The subsequent steps for forming the features shown in FIGS. 1, 2A, 3, 4, 5A, 5B, 6A, 6B, and 7 to 12 have been described above.

FIG. 15 shows a flow chart describing a method 1500 for forming fin structures in the first standard cell and the second standard cell of the array of standard cells of FIG. 1, in accordance with an embodiment. Step 1502 of method 1500 includes forming a patterned sacrificial layer over a first circuit region of a substrate and a second circuit region of the substrate. Step 1502 may, as an example, correspond to the process flow illustrated in FIGS. 13A to 13C and 14A to 14C. As a result of step 1502, the patterned sacrificial layer extending lengthwise along a first direction, where a longitudinal axis of the patterned sacrificial layer in the first circuit region is offset in a second direction relative to a longitudinal axis of the patterned sacrificial layer in the second circuit region, the second direction being generally perpendicular to the first direction.

Step 1504 of method 1500 includes forming spacers on sidewalls of the patterned sacrificial layer. Step 1504 may, as an example, correspond to the process flow illustrated in FIGS. 13D and 14D.

Step 1506 of method 1500 includes removing the patterned sacrificial layer, where the spacers remain over the first circuit region and the second circuit region of the substrate after the removing of the patterned sacrificial layer. Step 1506 may, as an example, correspond to the process flow illustrated in FIGS. 13E and 14E.

Step 1508 of method 1500 includes removing selective portions of the spacers disposed over the second circuit region to form a patterned spacer layer. Step 1508 may, as an example, correspond to the process flow illustrated in FIGS. 13F and 14F.

Step 1510 of method 1500 includes etching the substrate using the patterned spacer layer as an etch mask to form a plurality of fin lines in the first circuit region of the substrate and a single fin line in the second circuit region of the substrate, where a projection of a longitudinal axis of the single fin line along the first direction lies in a space separating adjacent ones of the plurality of fin lines. Step

1510 may, as an example, correspond to the process flow illustrated in FIGS. 13G and 14G.

In summary, the present disclosure proposes a layout for a first standard cell SC1 (having one or more multiple-fin FinFET device) and a second standard cell SC2 (having one or more single-fin FinFET device) that are located adjacent to each other along a row of an array of standard cells. In the proposed layout, a single-fin structure of the second standard cell SC2 is positioned such that the longitudinal axis of the single-fin structure, when projected from the second standard cell SC2 to the first standard cell SC1, lies in a space that separates adjacent fin structures of a multiple-fin Fin-FET device of the first standard cell SC1. The proposed layout alleviates constraints on the source/drain landing margin for the single-fin FinFET devices of the second standard cell SC2 and aligns the single-fin structures of the second standard cell SC2 to a center region of contacts (e.g. slot contacts) that land on and contact the drain features of the single-fin FinFET devices of the second standard cell SC2, which, in turn, decreases contact resistance and contact capacitance. While the present disclosure has been described with regards to fin structures of FinFET devices, it is noted that the spatial and positional features discussed above are also applicable to other non-planar transistor devices. For example, the first standard cell SC1 may include a P-type gate-all-around transistor devices having a plurality of nanowires or nanosheets, while the second standard cell SC2 may include a P-type gate-all-around transistor device having a single nanowire or a single nanosheet. The single nanowire or single nanosheet of the second standard cell SC2 may be positioned such that its longitudinal axis, when projected from the second standard cell SC2 to the first standard cell SC1, lies in a space that separates adjacent ones of the plurality of nanowires or nanosheets in the first standard cell SC1.

An embodiment integrated circuit device includes: a first device disposed within a first circuit region, the first device including a plurality of first semiconductor strips extending longitudinally in a first direction, where adjacent ones of the plurality of first semiconductor strips are spaced apart from each other in a second direction, the second direction being generally perpendicular to the first direction; and a second device disposed within a second circuit region, the second circuit region being adjacent to the first circuit region in the first direction, the second device including a second semiconductor strip extending longitudinally in the first direction, where a projection of a longitudinal axis of the second semiconductor strip along the first direction lies in a space separating the adjacent ones of the plurality of first semiconductor strips.

An embodiment integrated circuit device includes: a first row of standard cells extending in a first direction; and a second row of standard cells extending in the first direction, the second row of standard cells being adjacent to the first row of standard cells in a second direction generally orthogonal to the first direction. The first row of standard cells include: a first standard cell including a first FinFET device having a plurality of fin structures extending lengthwise in the first direction, where adjacent ones of the plurality of fin structures are spatially separated from each other in a second direction; and a second standard cell adjacent to the first standard cell in the first direction, the second standard cell including a second FinFET device having a single fin structure extending lengthwise in the first direction, the first FinFET device and the second FinFET device having a first conductivity-type, where an extension of a longitudinal axis of the single fin structure of the second FinFET device along the first direction is located in a space that spatially separates the adjacent ones of the plurality of fin structures from each other. The second row of standard cells include: a third standard cell including a third FinFET device having a single fin structure extending lengthwise in the first direction; and a fourth standard cell adjacent to the third standard cell in the first direction, the fourth standard cell including a fourth FinFET device having a single fin structure extending lengthwise in the first direction, the third FinFET device and the fourth FinFET device having a second conductivity-type different from the first conductivity-type.

An embodiment method includes: forming a patterned sacrificial layer over a first circuit region of a substrate and a second circuit region of the substrate, the patterned sacrificial layer extending lengthwise along a first direction, where a longitudinal axis of the patterned sacrificial layer in the first circuit region is offset in a second direction relative to a longitudinal axis of the patterned sacrificial layer in the second circuit region, the second direction being generally perpendicular to the first direction. The embodiment method further includes: forming spacers on sidewalls of the patterned sacrificial layer; and removing the patterned sacrificial layer, where the spacers remain over the first circuit region and the second circuit region of the substrate after the removing of the patterned sacrificial layer. The embodiment method additionally includes removing selective portions of the spacers disposed over the second circuit region to form a patterned spacer layer; and etching the substrate using the patterned spacer layer as an etch mask to form a plurality of fin lines in the first circuit region of the substrate and a single fin line in the second circuit region of the substrate, where a projection of a longitudinal axis of the single fin line along the first direction lies in a space separating adjacent ones of the plurality of fin lines.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method to form an integrated circuit (IC) structure with mandrel and spacer patterning, comprising:
forming a mandrel layer that includes three line segments, a first mandrel line segment disposed in a first circuit region and oriented in a first direction, a second mandrel line segment disposed in a second circuit region and oriented in the first direction, the second mandrel line segment being shifted from the first mandrel line segment along a second direction being orthogonal to the first direction, and a third mandrel line segment disposed in a gap region connecting the first mandrel line segment and the second mandrel line segment, wherein the third mandrel line segment is oriented in a third direction different from the first direction and the second direction;
forming spacers on sidewalls of the mandrel layer;
removing the mandrel layer; and removing portions of the spacers, resulting in patterned spacers that include a first subset in the first circuit region and oriented in the first direction and a second subset in the second circuit region and oriented in the first direction.

2. The method of claim 1, further comprising:

etching a substrate using the patterned spacers as an etch mask to form a plurality of fin lines in the first circuit region of the substrate and a single fin line in the second circuit region of the substrate, wherein a projection of a longitudinal axis of the single fin line along the first direction lies in a space separating adjacent ones of the plurality of fin lines, and wherein a projection of each longitudinal edge of the single fin line along the first direction lies in the space.

3. The method of claim 2, further comprising forming an isolation structure in the substrate, the isolation structure being disposed between the first circuit region and the second circuit region to electrically isolate the first circuit region from the second circuit region.

4. The method of claim 2, wherein each of the plurality of fin lines in the first circuit region includes a longitudinal axis along the first direction; and the single fin line in the second circuit region is connected to one of the plurality of fin lines through selective portions of the plurality of fin lines and the single fin line.

5. The method of claim 2, further comprising forming a first gate stack on the plurality of fin lines and a second gate stack on the single fin line, wherein a first gate stack and a second gate stack are longitudinally extended along the second direction, and wherein each of the first gate stack and the second gate stack includes a gate dielectric layer and a gate electrode on the gate dielectric layer.

6. The method of claim 1, further comprising forming a first dielectric gate stack on a boundary of the first circuit region; and forming a second dielectric gate stack on a boundary of the second circuit region.

7. An integrated circuit device, comprising:

a semiconductor substrate;

a first device disposed within a first circuit region, the first device including a plurality of first semiconductor strips vertically extending from the semiconductor substrate and extending longitudinally in a first direction, and a first gate stack disposed on the plurality of first semiconductor strips, wherein adjacent ones of the plurality of first semiconductor strips are spaced apart from each other in a second direction, the second direction being generally perpendicular to the first direction; and a second device disposed within a second circuit region, the second circuit region being adjacent to the first circuit region in the first direction, the second device including a single semiconductor strip vertically extending from the semiconductor substrate and extending longitudinally in the first direction, and a second gate stack disposed on the single semiconductor strip, wherein a projection of each longitudinal edge of the single semiconductor strip along the first direction lies in a space separating the adjacent ones of the plurality of first semiconductor strips, each of the first gate stack and the second gate stack extending longitudinally in the second direction.

8. The integrated circuit device of claim 7, wherein each of the single semiconductor strip and the plurality of first semiconductor strips includes a semiconductor fin structure.

9. The integrated circuit device of claim 7, wherein each of the single semiconductor strip and the plurality of first semiconductor strips includes a nanowire or a nanosheet.

10. The integrated circuit device of claim 7, further comprising a contact disposed on a surface of a source/drain feature of the single semiconductor strip, the surface of the source/drain feature being directed towards a third direction generally perpendicular to the first direction and the second direction, wherein the surface of the source/drain feature contacts a center region of the contact.

11. The integrated circuit device of claim 7, wherein the projection of the longitudinal edge of the single semiconductor strip along the first direction equally splits the space separating the adjacent ones of the plurality of first semiconductor strips.

12. The integrated circuit device of claim 7, wherein a width of each of the single semiconductor strip and the plurality of first semiconductor strips, measured in the second direction, is between about 5 nanometers and about 20 nanometers.

13. The integrated circuit device of claim 7, further comprising an isolation structure disposed between the first circuit region and the second circuit region to electrically isolate the first circuit region from the second circuit region.

14. The integrated circuit device of claim 13, wherein the isolation structure includes a dielectric gate structure.

15. An integrated circuit device, comprising:

a first standard cell having a first device, the first device including a plurality of first semiconductor strips extending longitudinally in a first direction, wherein adjacent ones of the plurality of first semiconductor strips are spaced apart from each other in a second direction, the second direction being generally perpendicular to the first direction; and a second standard cell having a second device disposed within a second circuit region, the second standard cell being adjacent to the first standard cell in the first direction, the second device including a plurality of second semiconductor strips extending longitudinally in the first direction, wherein a projection of a longitudinal axis of each one of the plurality of second semiconductor strips along the first direction lies in a space separating the adjacent ones of the plurality of first semiconductor strips, and wherein a projection of a longitudinal axis of each one of the plurality of first semiconductor strips along the first direction lies in a space separating adjacent ones of the plurality of second semiconductor strips.

16. The integrated circuit device of claim 15, wherein each of the plurality of first semiconductor strips and the plurality of second semiconductor strips includes a semiconductor fin structure.

17. The integrated circuit device of claim 15, wherein each of the plurality of first semiconductor strips and the second semiconductor strips includes a nanowire or a nanosheet.

18. The integrated circuit device of claim 15, further comprising a contact disposed on a surface of a source/drain feature, the surface of the source/drain feature being directed towards a third direction generally perpendicular to the first direction and the second direction, wherein the surface of the source/drain feature contacts a center region of the contact.

19. The integrated circuit device of claim 15, wherein the projection of the longitudinal axis of one of the plurality of second semiconductor strips along the first direction equally splits the space separating the adjacent ones of the plurality of first semiconductor strips.

20. The integrated circuit device of claim 15, further comprising a dielectric gate disposed between the first standard cell and the second standard cell to electrically isolate the first standard cell from the second standard cell.

* * * * *